United States Patent [19]
Silverbrook

[11] Patent Number: 6,071,750
[45] Date of Patent: Jun. 6, 2000

[54] METHOD OF MANUFACTURE OF A PADDLE TYPE INK JET PRINTER

[75] Inventor: Kia Silverbrook, Sydney, Australia

[73] Assignee: Silverbrook Research Pty Ltd, Balmain, Australia

[21] Appl. No.: 09/113,111

[22] Filed: Jul. 10, 1998

[30] Foreign Application Priority Data

Jul. 15, 1997 [AU] Australia ................... PO7991
Jul. 15, 1997 [AU] Australia ................... PO8065

[51] Int. Cl.[7] ................................. H01L 21/00
[52] U.S. Cl. ................... 438/21; 347/20; 347/47
[58] Field of Search ................... 438/21; 347/1, 347/9, 20, 29, 32, 68, 44, 47, 54, 55; 216/27; 251/129.01

[56] References Cited

U.S. PATENT DOCUMENTS 5,889,541   3/1999  Bobrow et al. ................ 347/55

*Primary Examiner*—John F. Niebling
*Assistant Examiner*—Christopher Lattin

[57] ABSTRACT

This patent describes a method of manufacturing a paddle type ink jet print head wherein an array of nozzles are formed on a substrate utilizing planar monolithic deposition, lithographic and etching processes. Multiple ink jet heads are formed simultaneously on a single planar substrate such as a silicon wafer. The print heads can be formed utilizing standard VLSI/ULSI processing and can include integrated drive electronics formed on the same substrate. The drive electronics preferably are of a CMOS type. In the final construction, ink can be ejected from the substrate substantially normal to the substrate plane.

14 Claims, 7 Drawing Sheets

6,071,750

METHOD OF MANUFACTURE OF A PADDLE TYPE INK JET PRINTER

CROSS REFERENCES TO RELATED APPLICATIONS

The following co-pending U.S. patent applications, identified by their U.S. patent application Ser. Nos. (USSN), were filed simultaneously to the present application on Jul. 10, 1998, and are hereby incorporated by cross-reference.

| Docket No. | Reference | Title |
| --- | --- | --- |
| IJ01US | IJ01 | Radiant Plunger Ink Jet Printer |
| IJ02US | IJ02 | Electrostatic Ink Jet Printer |
| IJ03US | IJ03 | Planar Thermoelastic Bend Actuator Ink Jet |
| IJ04US | IJ04 | Stacked Electrostatic Ink Jet Printer |
| IJ05US | IJ05 | Reverse Spring Lever Ink Jet Printer |
| IJ06US | IJ06 | Paddle Type Ink Jet Printer |
| IJ07US | IJ07 | Permanent Magnet Electromagnetic Ink Jet Printer |
| IJ08US | IJ08 | Planar Swing Grill Electromagnetic Ink Jet Printer |
| IJ09US | IJ09 | Pump Action Refill Ink Jet Printer |
| IJ10US | IJ10 | Pulsed Magnetic Field Ink Jet Printer |
| IJ11US | IJ11 | Two Plate Reverse Firing Electromagnetic Ink Jet Printer |
| IJ12US | IJ12 | Linear Stepper Actuator Ink Jet Printer |
| IJ13US | IJ13 | Gear Driven Shutter Ink Jet Printer |
| IJ14U5 | IJ14 | Tapered Magnetic Pole Electromagnetic Ink Jet Printer |
| IJ15US | IJ15 | Linear Spring Electromagnetic Grill Ink Jet Printer |
| IJ16US | IJ16 | Lorenz Diaphragm Electromagnetic Ink Jet Printer |
| IJ17US | 1117 | PTFE Surface Shooting Shuttered Oscillating Pressure Ink Jet Printer |
| IJ18U5 | IJ18 | Buckle Grip Oscillating Pressure Ink Jet Printer |
| IJ19US | IJ19 | Shutter Based Ink Jet Printer |
| IJ20US | IJ20 | Curling Calyx Thermoelastic Ink Jet Printer |
| IJ21US | IJ21 | Thermal Actuated Ink Jet Printer |
| IJ22US | IJ22 | Iris Motion Ink Jet Printer |
| IJ23US | IJ23 | Direct Firing Thermal Bend Actuator Ink Jet Printer |
| IJ24U5 | IJ24 | Conductive PTFE Ben Activator Vented Ink Jet Printer |
| IJ25U5 | IJ25 | Magnetostrictive Ink Jet Printer |
| IJ26US | IJ26 | Shape Memory Alloy Ink Jet Printer |
| IJ27U5 | IJ27 | Buckle Plate Ink Jet Printer |
| IJ28U5 | IJ28 | Thermal Elastic Rotary Impeller Ink Jet Printer |
| IJ29US | IJ29 | Thermoelastic Bend Actuator Ink Jet Printer |
| IJ30US | IJ30 | Thermoelastic Bend Actuator Using PTFE and Corrugated Copper Ink Jet Printer |
| IJ31US | IJ31 | Bend Actuator Direct Ink Supply Ink Jet Printer |
| IJ32US | IJ32 | A High Young's Modulus Thermoelastic Ink Jet Printer |
| IJ33US | IJ33 | Thermally actuated slotted chamber wall ink jet printer |
| IJ34US | IJ34 | Ink Jet Printer having a thermal actuator comprising an external coiled spring |
| IJ35US | IJ35 | Trough Container Ink Jet Printer |
| IJ36US | IJ36 | Dual Chamber Single Vertical Actuator Ink Jet |
| IJ37US | IJ37 | Dual Nozzle Single Horizontal Fulcrum Actuator Ink Jet |
| IJ38US | IJ38 | Dual Nozzle Single Horizontal Actuator Ink Jet |
| IJ39US | IJ39 | A single bend actuator cupped paddle ink jet printing device |
| IJ40US | IJ40 | A thermally actuated ink jet printer having a series of thermal actuator units |
| IJ41US | IJ41 | A thermally actuated ink jet printer including a tapered heater element |
| IJ42US | IJ42 | Radial Back-Curling Thermoelastic Ink Jet |
| IJ43US | IJ43 | Inverted Radial Back-Curling Thermoelastic Ink Jet |
| IJ44US | IJ44 | Surface bend actuator vented ink supply ink jet printer |
| IJ45U5 | IJ45 | Coil Acutuated Magnetic Plate Ink Jet Printer |

FIELD OF THE INVENTION

The present invention relates to the manufacture of ink jet print heads and, in particular, discloses a method of manufacture of a Paddle Type Ink Jet Printer.

BACKGROUND OF THE INVENTION

Many ink jet printing mechanisms are known. Unfortunately, in mass production techniques, the production of ink jet heads is quite difficult. For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantially expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet print heads and therefore add substantially to their final cost.

It would therefore be desirable if an efficient system for the mass production of ink jet print heads could be developed.

SUMMARY OF THE INVENTION

It is an object of the present invention to provide a method for the creation of a paddle type ink jet printer.

In accordance with a first aspect of the present invention, there is provided a method of manufacturing a paddle type ink jet print head wherein an array of nozzles are formed on a substrate utilising planar monolithic deposition, lithographic and etching processes. Preferably, multiple ink jet heads are formed simultaneously on a single planar substrate such as a silicon wafer.

The print heads can be formed utilising standard vlsi/ulsi processing and can include integrated drive electronics formed on the same substrate. The drive electronics preferably are of a CMOS type. In the final construction, ink can be ejected from the substrate substantially normal to the substrate.

In accordance with a further aspect of the present invention, there is provided a method of manufacture of an ink jet print head arrangement including a series of nozzle chambers, the method comprising the steps of: (a) utilizing an initial semiconductor wafer having an electrical circuitry layer and a buried epitaxial layer formed thereon, in addition to a top protecting layer having a series of vias interconnected to predetermined portions of the circuitry layer; (b) forming on the semiconductor wafer layer a first conductive layer including a first conductive coil interconnected to predetermined portions of the circuitry layer; (c) depositing and etching, on the first conductive layer, a non-conductive layer including predetermined vias for the interconnection of subsequent layers with lower layers; (d) forming a second conductive layer on the nonconducting layer, including a second conductive coil and the interconnection of predetermined portions of the coil with the first conductive coil and the circuitry layer; (e) depositing and etching a second non-conductive layer over the second conductive layer the etching including etching a series of slots in the second non-conductive layer; (f) etching a series of slots through the first and second non-conductive layers, the first and second conductive layers so as to define a nozzle paddle; (g) etching the semiconductor wafer under the nozzle paddle so as to define a nozzle chamber; (h) back etching the semiconductor wafer to the epitaxial layer; and (i) etching the epitaxial layer to define a nozzle ejection hole therein interconnecting with the nozzle chamber;

The step (g) can comprise a crystallographic etch and can utilize the epitaxial layer as an etch stop.

The step (i) preferably can include etching a series of small holes in a wall of the nozzle chamber interconnecting the chamber with the ambient atmosphere.

The first conductive layer and the second conductive layer are preferably formed from substantially copper.

The steps are preferably also utilized to simultaneously separate the wafer into separate printheads.

BRIEF DESCRIPTION OF THE DRAWINGS

Notwithstanding any other forms which may fall within the scope of the present invention, preferred forms of the invention will now be described, by way of example only, with reference to the accompanying drawings which.

DESCRIPTION OF PREFERRED AND OTHER EMBODIMENTS

Figure 1:
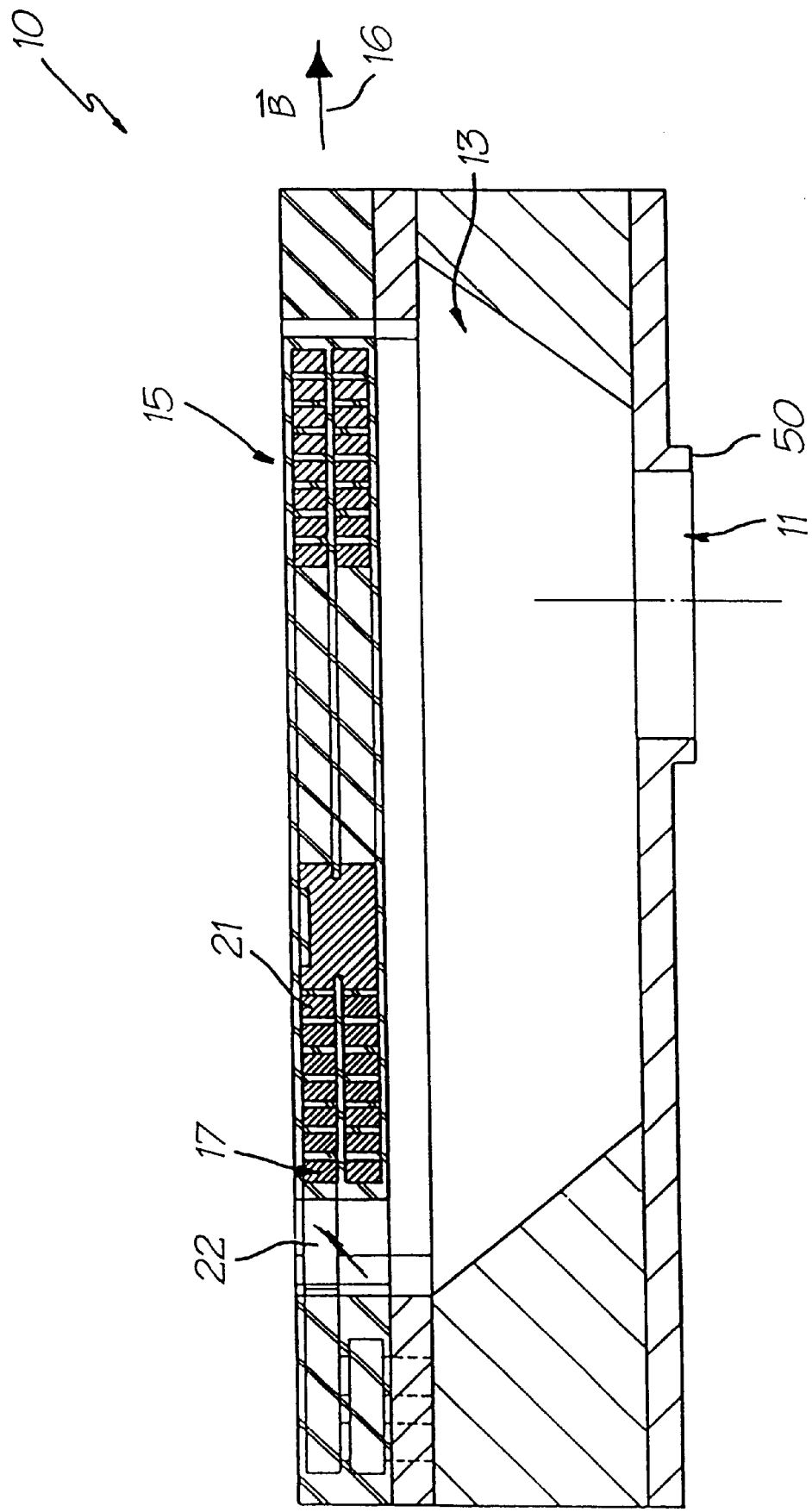
FIG. 1 is a cross-sectional view of a single ink jet nozzle constructed in accordance with the preferred embodiment in its quiescent state.

Referring now to FIG. 1, there is illustrated a cross-sectional view of a single ink nozzle unit 10 constructed in accordance with the preferred embodiment. The ink nozzle unit 10 includes an ink ejection nozzle 11 for the ejection of ink which resides in a nozzle chamber 13. The ink is ejected from the nozzle chamber 13 by means of movement of paddle 15. The paddle 15 operates in a magnetic field 16 which runs along the plane of the paddle 15. The paddle 15 includes at least one solenoid coil 17 which operates under the control of nozzle activation signal. The paddle 15 operates in accordance with the well known principal of the force experienced by a moving electric charge in a magnetic field. Hence, when it is desired to activate the paddle 15 to eject an ink drop out of ink ejection nozzle 11, the solenoid coil 17 is activated. As a result of the activation, one end of the paddle will experience a downward force 19 while the other end of the paddle will experience an upward force 20. The downward force 19 results in a corresponding movement of the paddle and the resultant ejection of ink.

Figure 2:
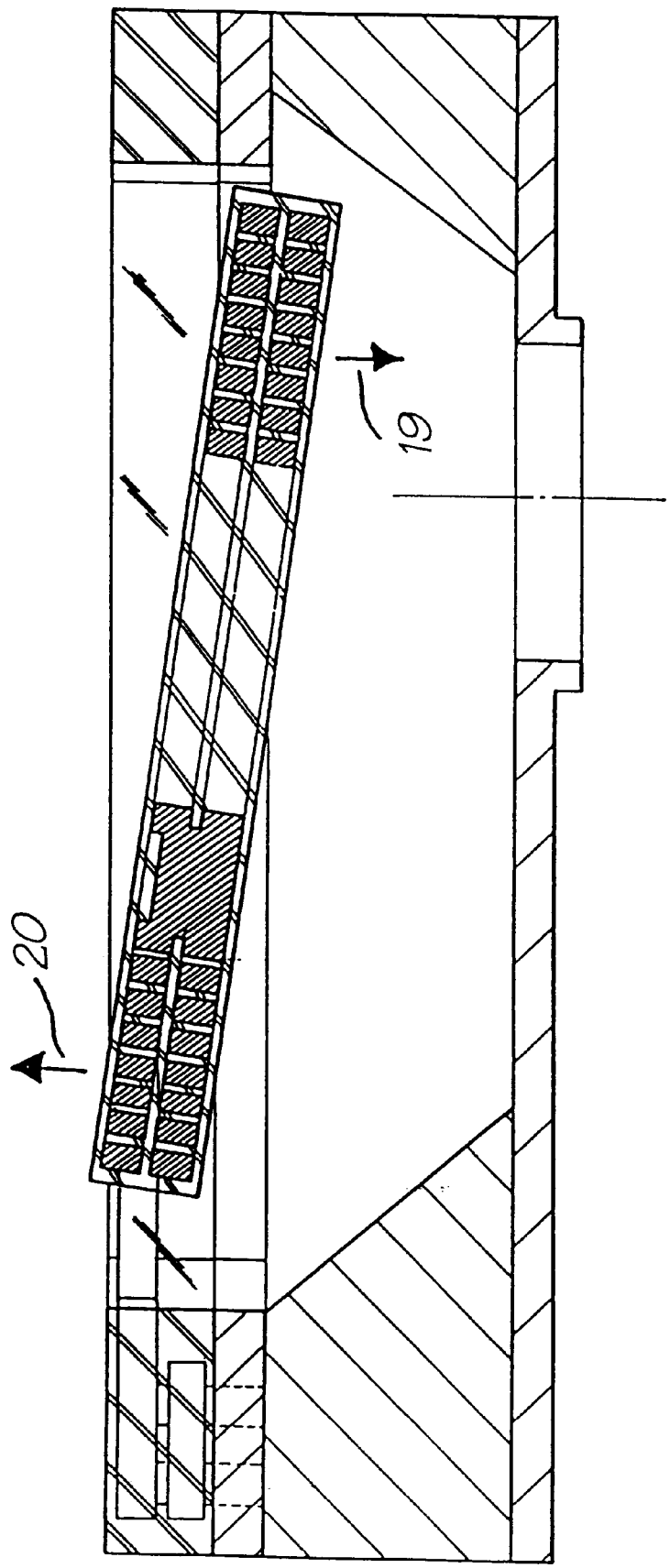
FIG. 2 is a cross-sectional view of a single ink jet nozzle constructed in accordance with the preferred embodiment, illustrating the state upon activation of the actuator.

As can be seen from the cross section of FIG. 1, the paddle 15 can comprise multiple layers of solenoid wires with the solenoid wires, e.g. 21, forming a complete circuit having the current flow in a counter clockwise direction around a centre of the paddle 15. This results in paddle 15 experiencing a rotation about an axis through (as illustrated in FIG. 2) the centre point the rotation being assisted by means of a torsional spring, e.g. 22, which acts to return the paddle 15 to its quiescent state after deactivation of the current paddle 15. Whilst a torsional spring 22 is to be preferred it is envisaged that other forms of springs may be possible such as a leaf spring or the like.

The nozzle chamber 13 refills due to the surface tension of the ink at the ejection nozzle 11 after the ejection of ink.

Manufacturing Construction Process

The construction of the ink jet nozzles can proceed by way of utilisation of microelectronic fabrication techniques commonly known to those skilled in the field of semi-conductor fabrication. For a general introduction to a micro-electro mechanical system (MEMS) reference is made to standard proceedings in this field including the proceedings of the SPIE (International Society for Optical Engineering), volumes 2642 and 2882 which contain the proceedings for recent advances and conferences in this field.

In accordance with one form of construction, two wafers are utilized upon which the active circuitry and ink jet print nozzles are fabricated and a further wafer in which the ink channels are fabricated.

Figure 3:
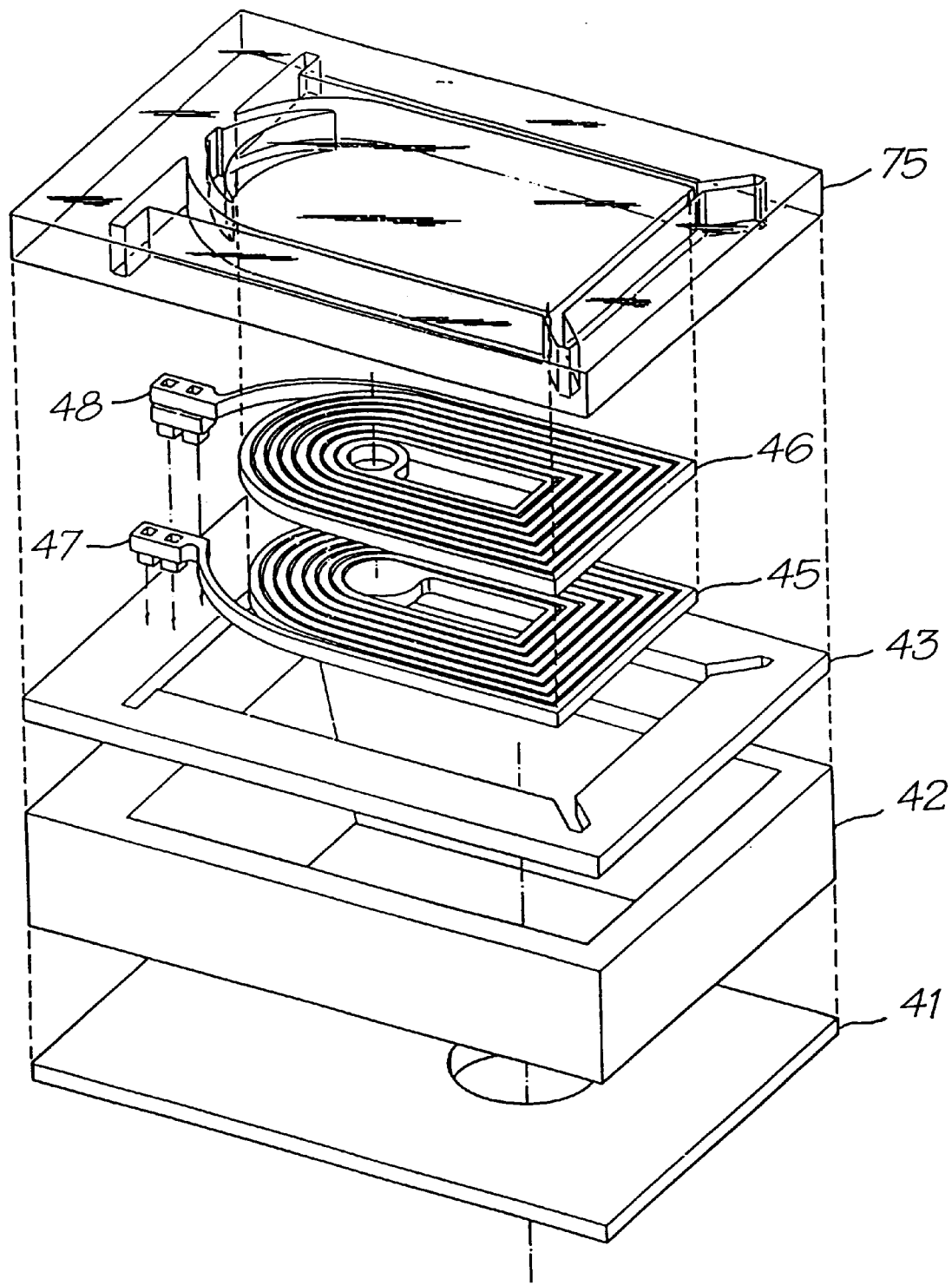
FIG. 3 is an exploded perspective view illustrating the construction of a single ink jet nozzle in accordance with the preferred embodiment.

Turning now to FIG. 3, there is illustrated an exploded perspective view of a single ink jet nozzle constructed in accordance with the preferred embodiment. Construction begins which a silicon wafer 40 upon which has been fabricated an epitaxial boron doped layer 41 and an epitaxial silicon layer 42. The boron layer is doped to a concentration of preferably $10^{20}/cm^3$ of boron or more and is approximately 2 microns thick. The silicon epitaxial layer is constructed to be approximately 8 microns thick and is doped in a manner suitable for the active semi conductor device technology.

Next, the drive transistors and distribution circuitry are constructed in accordance with the fabrication process chosen resulting in a CMOS logic and drive transistor level 43. A silicon nitride layer 44 is then deposited.

The paddle metal layers are constructed utilizing a damascene process which is a well known process utilizing chemical mechanical polishing techniques (CMP) well known for utilization as a multi-level metal application. The solenoid coils in paddle 15 (FIG. 1) can be constructed from a double layer which for a first layer 45, is produced utilising a single damascene process.

Next, a second layer 46 is deposited utilizing this time a dual damascene process. The copper layers 45, 46 include contact posts 47, 48, for interconnection of the electromagnetic coil to the CMOS layer 43 through vias in the silicon nitride layer 44 (not shown). However, the metal post portion also includes a via interconnecting it with the lower copper level. The damascene process is finished with a planarised glass layer. The glass layers produced during utilisation of the damascene processes utilised for the deposition of layers 45, 46, are shown as one layer 75 in FIG. 3.

Subsequently, the paddle is formed and separated from the adjacent glass layer by means of a plasma edge as the edge being down to the position of stop layer 80. Further, the nozzle chamber 13 underneath the panel is removed by means of a silicon anisotropic wet edge which will edge down to the boron layer 41. A passivation layer is then applied. The passivation layer can comprise a conformable diamond like carbon layer or a high density $Si_3N_4$ coating, this coating provides a protective layer for the paddle and its surrounds as the paddle must exist in the highly corrosive environment of water and ink.

Figure 4:
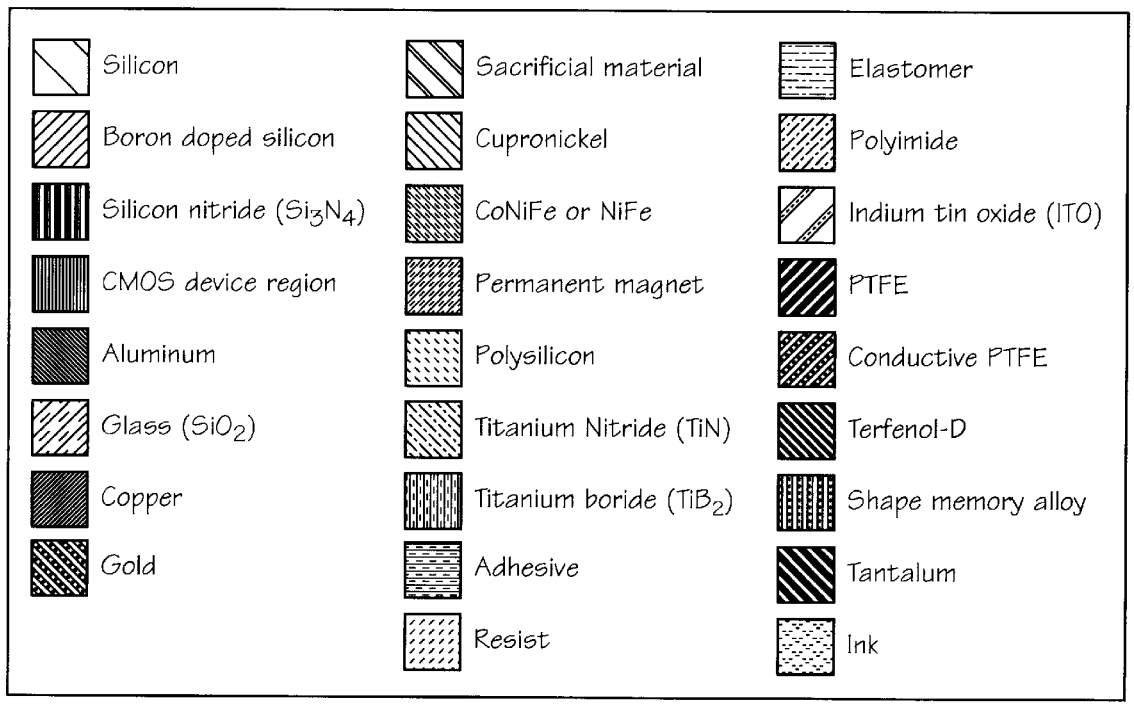
FIG. 4 provides a legend of the materials indicated in FIGS. 5 to 15.
Figure 5:
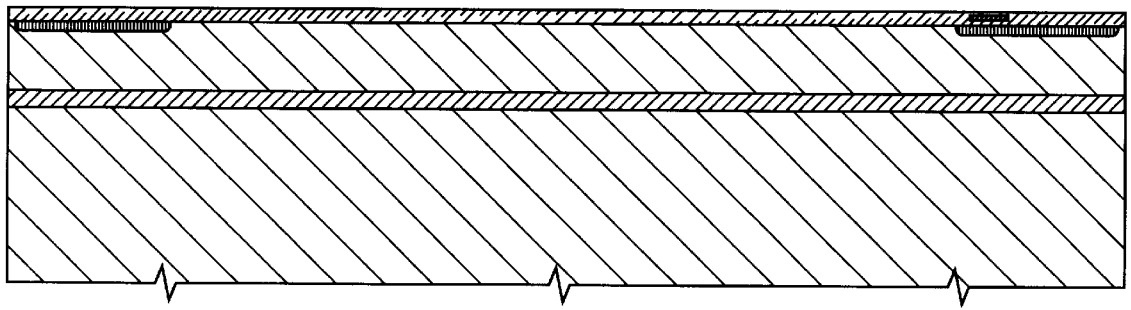
FIG. 5 to FIG. 15 illustrate sectional views of the manufacturing steps in one form of construction of an ink jet printhead nozzle.
Figure 6:
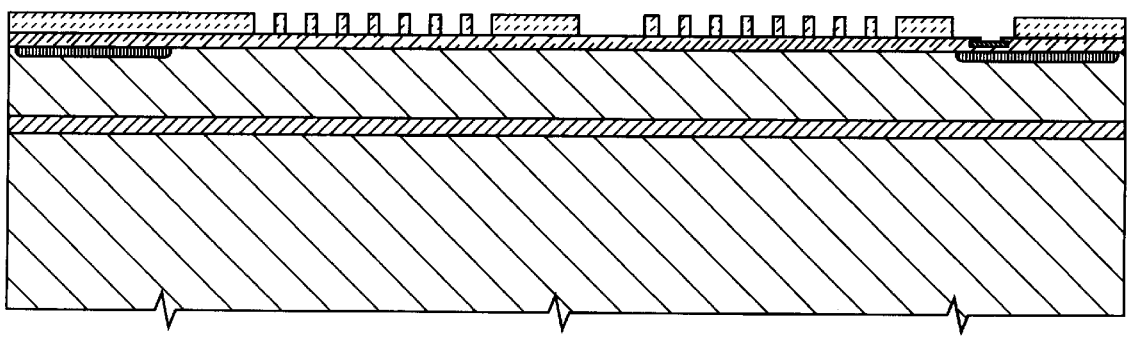
Figure 7:
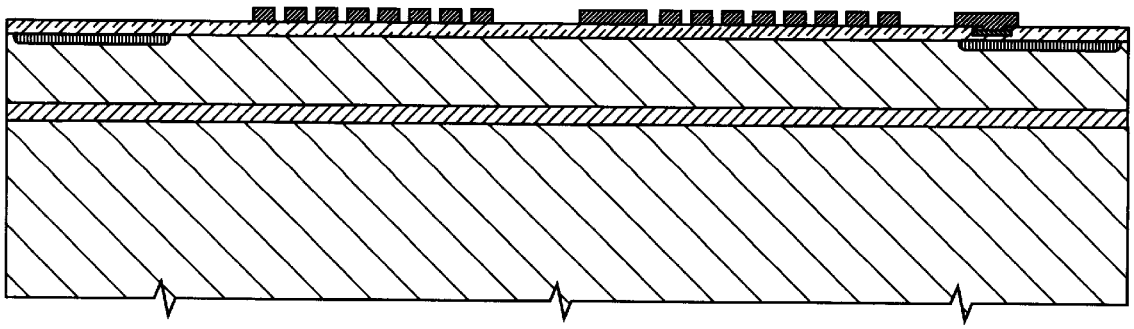
Figure 8:
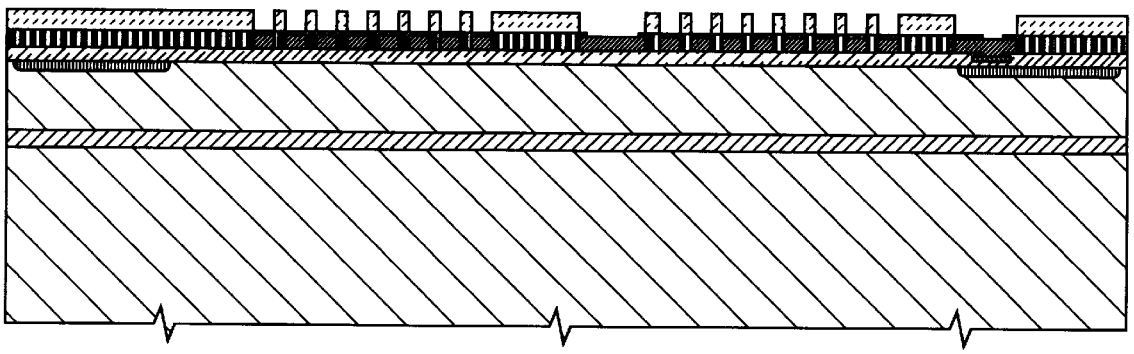
Figure 9:
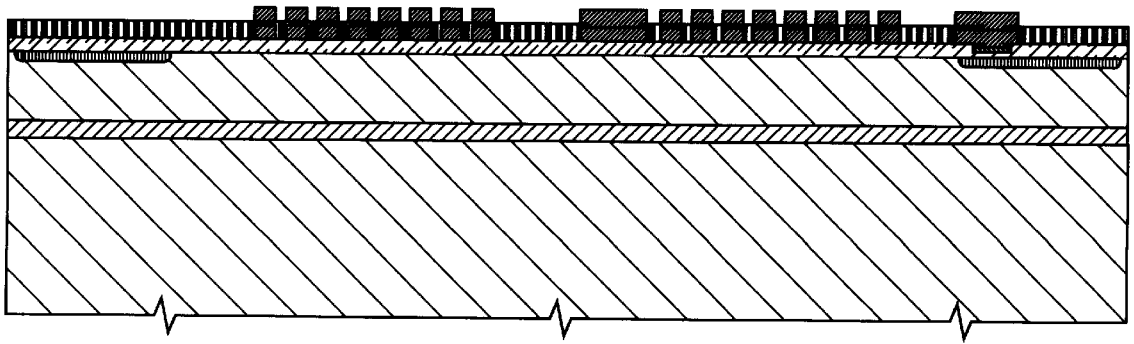
Figure 10:
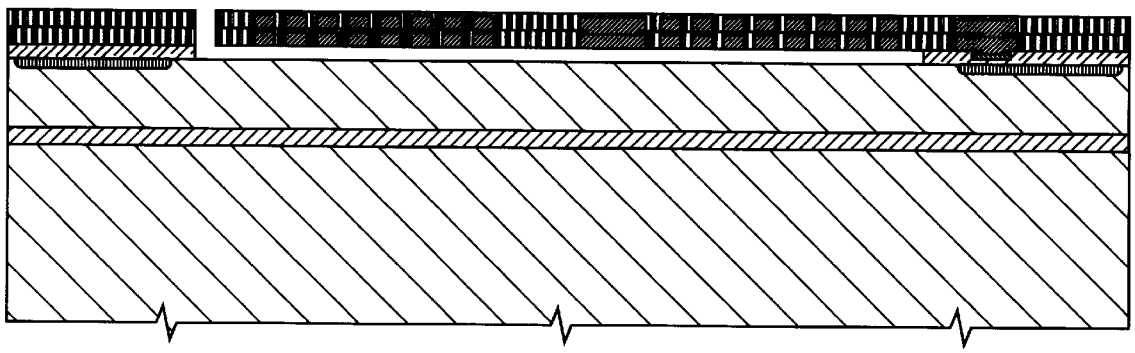
Figure 11:
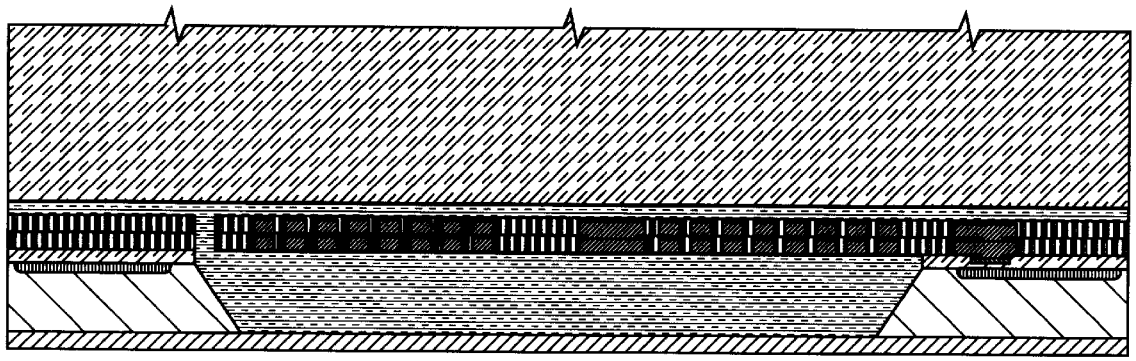
Figure 12:
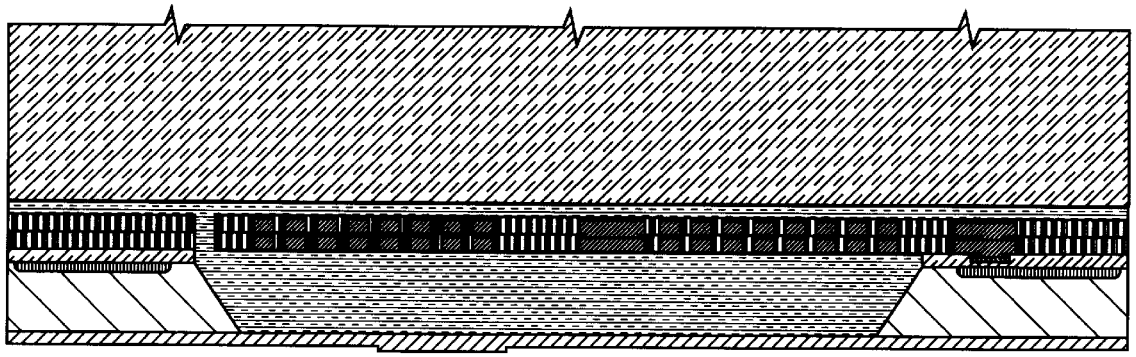
Figure 13:
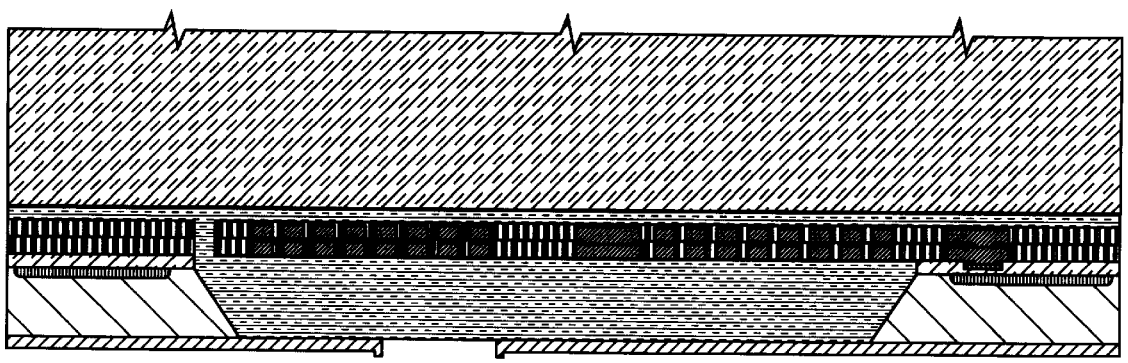
Figure 14:
Figure 15:
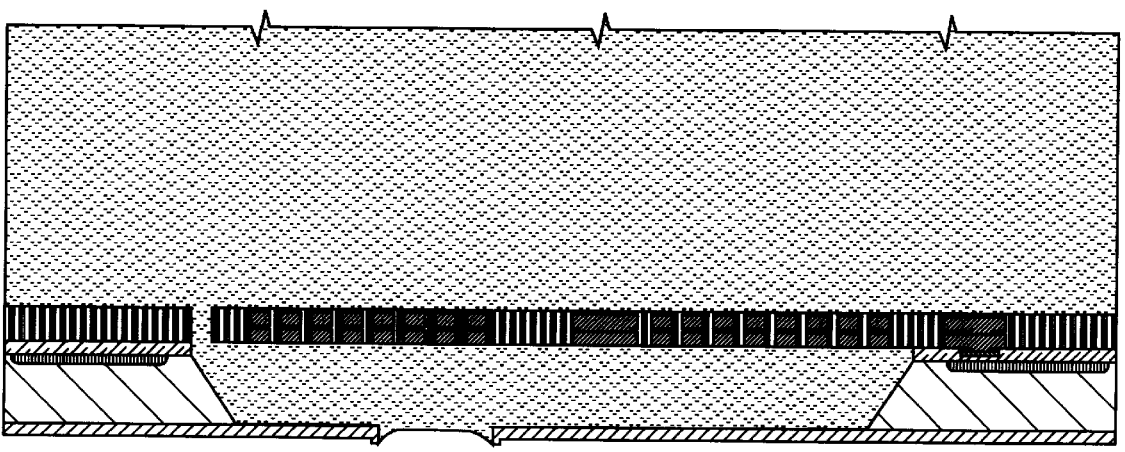

Next, the silicon wafer can be back-etched through the boron doped layer and the ejection port 11 and an ejection port rim 50 (FIG. 1) can also be formed utilising etching procedures. One form of alternative detailed manufacturing process which can be used to fabricate monolithic ink jet print heads operating in accordance with the principles taught by the present embodiment can proceed utilizing the following steps:

1. Using a double sided polished wafer deposit 3 microns of epitaxial silicon heavily doped with boron.
2. Deposit 10 microns of epitaxial silicon, either p-type or n-type, depending upon the CMOS process used.
3. Complete a 0.5 micron, one poly, 2 metal CMOS process. This step is shown in FIG. 5. For clarity, these diagrams may not be to scale, and may not represent a cross section though any single plane of the nozzle. FIG. 4 is a key to representations of various materials in these manufacturing diagrams, and those of other cross referenced ink jet configurations.
4. Deposit 0.1 microns of silicon nitride (Si3N4).
5. Etch the nitride layer using Mask 1. This mask defines the contact vias from the solenoid coil to the second-level metal contacts.
6. Deposit a seed layer of copper. Copper is used for its low resistivity (which results in higher efficiency) and its high electromigration resistance, which increases reliability at high current densities.
7. Spin on 3 microns of resist, expose with Mask 2, and develop. This mask defines the first level coil of the solenoid. The resist acts as an electroplating mold. This step is shown in FIG. 6.
8. Electroplate 2 microns of copper.
9. Strip the resist and etch the exposed copper seed layer. This step is shown in FIG. 7.
10. Deposit 0.1 microns of silicon nitride (Si3N4).
11. Etch the nitride layer using Mask 3. This mask defines the contact vias between the first level and the second level of the solenoid.
12. Deposit a seed layer of copper.
13. Spin on 3 microns of resist, expose with Mask 4, and develop. This mask defines the second level coil of the solenoid. The resist acts as an electroplating mold. This step is shown in FIG. 8.
14. Electroplate 2 microns of copper.
15. Strip the resist and etch the exposed copper seed layer. This step is shown in FIG. 9.
16. Wafer probe. All electrical connections are complete at this point, bond pads are accessible, and the chips are not yet separated.
17. Deposit 0.1 microns of silicon nitride.
18. Etch the nitride and CMOS oxide layers down to silicon using Mask 5. This mask defines the nozzle chamber mask and the edges of the print heads chips for crystallographic wet etching. This step is shown in FIG. 10.
19. Crystallographically etch the exposed silicon using KOH. This etch stops on <111> crystallographic planes, and on the boron doped silicon buried layer. Due to the design of Mask 5, this etch undercuts the silicon, providing clearance for the paddle to rotate downwards.
20. Mount the wafer on a glass blank and back-etch the wafer using KOH, with no mask. This etch thins the wafer and stops at the buried boron doped silicon layer. This step is shown in FIG. 11.
21. Plasma back-etch the boron doped silicon layer to a depth of 1 micron using Mask 6. This mask defines the nozzle rim. This step is shown in FIG. 12.
22. Plasma back-etch through the boron doped layer using Mask 7. This mask defines the nozzle, and the edge of the chips. At this stage, the chips are separate, but are still mounted on the glass blank. This step is shown in FIG. 13.
23. Strip the adhesive layer to detach the chips from the glass blank. This step is shown in FIG. 14.
24. Mount the print heads in their packaging, which may be a molded plastic former incorporating ink channels which supply different colors of ink to the appropriate regions of the front surface of the wafer.
25. Connect the print heads to their interconnect systems.
26. Hydrophobize the front surface of the print heads.
27. Fill with ink, apply a strong magnetic field in the plane of the chip surface, and test the completed print heads. A filled nozzle is shown in FIG. 15.

It can be seen from the foregoing description that the preferred embodiment comprises a new form of ink ejection device having advantages over the aforementioned ink jet printers. Further, there has been described one form of construction of such an ink jet device although it would be obvious to those skilled in the art that many alternative constructions are possible. The construction of the panel type ink jet printer is varied in accordance with those complex variable decisions made in the construction of integrated circuit type devices.

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)
high resolution capability (1,600 dpi or more)
photographic quality output
low manufacturing cost
small size (pagewidth times minimum cross section)
high speed (<2 seconds per page).

All of these features can be met or exceeded by the ink jet systems described below with differing levels of difficulty.

Forty-five different ink jet technologies have been developed by the Assignee to give a wide range of choices for high volume manufacture. These technologies form part of separate applications assigned to the present Assignee as set out in the table below.

The ink jet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the ink jet type. The smallest print head designed is IJ38, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Tables of Drop-on-Demand Ink Jets

The present invention is useful in the field of digital printing, in particular, ink jet printing. A number of patent applications in this field were filed simultaneously and incorporated by cross reference.

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)
Basic operation mode (7 types)
Auxiliary mechanism (8 types)
Actuator amplification or modification method (17 types)
Actuator motion (19 types)
Nozzle refill method (4 types)
Method of restricting back-flow through inlet (10 types)
Nozzle clearing method (9 types)
Nozzle plate construction (9 types)
Drop ejection direction (5 types)
Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. These are designated IJ01 to IJ45 which matches the docket numbers in the table under the heading CROSS REFERENCES TO RELATED APPLICATIONS.

Other ink jet configurations can readily be derived from these 45 examples by substituting alternative configurations along one or more of the 11 axes. Most of the IJ01 to IJ45 examples can be made into ink jet print heads with characteristics superior to any currently available ink jet technology.

Where there are prior art examples known to the inventor, one or more of these examples are listed in the examples column of the tables below. The IJ01 to IJ45 series are also listed in the examples column. In some cases, a printer may be listed more than once in a table, where it shares characteristics with more than one entry.

Suitable applications include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| Actuator Mechanism | Description | Advantages | Disadvantages | Examples |
|---|---|---|---|---|
| ACTUATOR MECHANISM (APPLIED ONLY TO SELECTED INK DROPS) | | | | |
| Thermal bubble | An electrothermal heater heats the ink to above boiling point, transferring significant heat to the aqueous ink. A bubble nucleates and quickly forms, expelling the ink. The efficiency of the process is low, with typically less than 0.05% of the electrical energy being transformed into kinetic energy of the drop. | ♦ Large force generated<br>♦ Simple construction<br>♦ No moving parts<br>♦ Fast operation<br>♦ Small chip area required for actuator | ♦ High power<br>♦ Ink carrier limited to water<br>♦ Low efficiency<br>♦ High temperatures required<br>♦ High mechanical stress<br>♦ Unusual materials required<br>♦ Large drive transistors<br>♦ Cavitation causes actuator failure<br>♦ Kogation reduces bubble formation<br>♦ Large print heads are difficult to fabricate | ♦ Canon Bubblejet 1979 Endo et al GB patent 2,007,162<br>♦ Xerox heater-in-pit 1990 Hawkins et al U.S. Pat. No. 4,899,181<br>♦ Hewlett-Packard TIJ 1982 Vaught et al U.S. Pat. No. 4,490,728 |
| Piezoelectric | A piezoelectric crystal such as lead lanthanum zirconate (PZT) is electrically activated, and either expands, shears, or bends to apply pressure to the ink, ejecting drops. | ♦ Low power consumption<br>♦ Many ink types can be used<br>♦ Fast operation<br>♦ High efficiency | ♦ Very large area required for actuator<br>♦ Difficult to integrate with electronics<br>♦ High voltage drive transistors required<br>♦ Full pagewidth print heads impractical due to actuator size<br>♦ Requires electrical poling in high field strengths during manufacture | ♦ Kyser et al U.S. Pat. No. 3,946,398<br>♦ Zoltan U.S. Pat. No. 3,683,212<br>♦ 1973 Stemme U.S. Pat. No. 3,747,120<br>♦ Epson Stylus<br>♦ Tektronix<br>♦ IJ04 |
| Electro- | An electric field is used to activate | ♦ Low power consumption | ♦ Low maximum strain (approx. 0.01%) | ♦ Seiko Epson, |

-continued

| | | | | |
|---|---|---|---|---|
| strictive | electrostriction in relaxor materials such as lead lanthanum zirconate titanate (PLZT) or lead magnesium niobate (PMN). | ◆ Many ink types can be used<br>◆ Low thermal expansion<br>◆ Electric field strength required (approx. 3.5 V/$\mu$m) can be generated without difficulty<br>◆ Does not require electrical poling | ◆ Large area required for actuator due to low strain<br>◆ Response speed is marginal (~10 $\mu$s)<br>◆ High voltage drive transistors required<br>◆ Full pagewidth print heads impractical due to actuator size | Usui et all JP 253401/96<br>◆ IJ04 |
| Ferroelectric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | ◆ Low power consumption<br>◆ Many ink types can be used<br>◆ Fast operation (<1 $\mu$s)<br>◆ Relatively high longitudinal strain<br>◆ High efficiency<br>◆ Electric field strength of around 3 V/$\mu$m can be readily provided | ◆ Difficult to integrate with electronics<br>◆ Unusual materials such as PLZSnT are required<br>◆ Actuators require a large area | ◆ IJ04 |
| Electrostatic plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | ◆ Low power consumption<br>◆ Many ink types can be used<br>◆ Fast operation | ◆ Difficult to operate electrostatic devices in an aqueous environment<br>◆ The electrostatic actuator will normally need to be separated from the ink<br>◆ Very large area required to achieve high forces<br>◆ High voltage drive transistors may be required<br>◆ Full pagewidth print heads are not competitive due to actuator size | ◆ IJ02, IJ04 |
| Electrostatic pull on ink | A strong electric field is applied to the ink, whereupon electrostatic attraction accelerates the ink towards the print medium. | ◆ Low current consumption<br>◆ Low temperature | ◆ High voltage required<br>◆ May be damaged by sparks due to air breakdown<br>◆ Required field strength increases as the drop size decreases<br>◆ High voltage drive transistors required<br>◆ Electrostatic field attracts dust | ◆ 1989 Saito et al, U.S. Pat. No. 4,799,068<br>◆ 1989 Miura et al, U.S. Pat. No. 4,810,954<br>◆ Tone-jet |
| Permanent magnet electromagnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | ◆ Low power consumption<br>◆ Many ink types can be used<br>◆ Fast operation<br>◆ High efficiency<br>◆ Easy extension from single nozzles to pagewidth print heads | ◆ Complex fabrication<br>◆ Permanent magnetic material such as Neodymium Iron Boron(NdFeB) required.<br>◆ High local currents required<br>◆ Copper metalization should be used for long electromigration lifetime and low resistivity<br>◆ Pigmented inks are usually infeasible<br>◆ Operating temperature limited to the Curie temperature (around 540 K.) | ◆ IJ07, IJ10 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | ◆ Low power consumption<br>◆ Many ink types can be used<br>◆ Fast operation<br>◆ High efficiency<br>◆ Easy extension from single nozzles to pagewidth print heads | ◆ Complex fabrication<br>◆ Materials not usually present in a CMOS fab such as NiFe, CoNiFe, or CoFe are required<br>◆ High local currents required<br>◆ Copper metalization should be used for long electromigration lifetime and low resistivity<br>◆ Electroplating is required<br>◆ High saturation flux density is required (2.0–2.1 T is achievable with CoNiFe [1]) | ◆ IJ01, IJ05, IJ08, IJ10<br>◆ IJ12, IJ14, IJ15, IJ17 |
| Magnetic Lorenz force | The Lorenz force acting on a current carrying wire in a magnetic field is utilized.<br>This allows the magnetic field to be supplied externally to the print head, for example with rare earth permanent magnets.<br>Only the current carrying wire need be fabricated on the print-head, simplifying materials requirements. | ◆ Low power consumption<br>◆ Many ink types can be used<br>◆ Fast operation<br>◆ High efficiency<br>◆ Easy extension from single nozzles to pagewidth print heads | ◆ Force acts as a twisting motion<br>◆ Typically, only a quarter of the solenoid length provides force in a useful direction<br>◆ High local currents required<br>◆ Copper metalization should be used for long electromigration lifetime and low resistivity<br>◆ Pigmented inks are usually infeasible | ◆ IJ06, IJ11, IJ13, IJ16 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | ◆ Many ink types can be used<br>◆ Fast operation<br>◆ Easy extension from single nozzles to pagewidth print heads<br>◆ High force is available | ◆ Force acts as a twisting motion<br>◆ Unusual materials such as Terfenol-D are required<br>◆ High local currents required<br>◆ Copper metalization should be used for long electromigration lifetime and low resistivity<br>◆ Pre-stressing may be required | ◆ Fischenbeck, U.S. Pat. No. 4,032,929<br>◆ IJ25 |
| Surface tension reduction | Ink under positive pressure is held in a nozzle by surface tension. The surface tension of the ink is reduced below the bubble threshold, causing | ◆ Low power consumption<br>◆ Simple construction<br>◆ No unusual materials required in fabrication | ◆ Requires supplementary force to effect drop separation<br>◆ Requires special ink surfactants<br>◆ Speed may be limited by surfactant | ◆ Silverbrook, EP 0771 658 A2 and related patent applications |

-continued

| | | | | |
|---|---|---|---|---|
| | the ink to egress from the nozzle. | ♦ High efficiency<br>♦ Easy extension from single nozzles to pagewidth print heads | properties | |
| Viscosity reduction | The ink viscosity is locally reduced to select which drops are to be ejected. A viscosity reduction can be achieved electrothermally with most inks, but special inks can be engineered for a 100:1 viscosity reduction. | ♦ Simple construction<br>♦ No unusual materials required in fabrication<br>♦ Easy extension from single nozzles to pagewidth print heads | ♦ Requires supplementary force to effect drop separation<br>♦ Requires special ink viscosity properties<br>♦ High speed is difficult to achieve<br>♦ Requires oscillating ink, pressure<br>♦ A high temperature difference (typically 80 degrees) is required | ♦ Silverbrook, EP 0771 658 A2 and related patent applications |
| Acoustic | An acoustic wave is generated and focussed upon the drop ejection region. | ♦ Can operate without a nozzle plate | ♦ Complex drive circuitry<br>♦ Complex fabrication<br>♦ Low efficiency<br>♦ Poor control of drop position<br>♦ Poor control of drop volume | ♦ 1993 Hadimioglu et al, EUP 550,192<br>♦ 1993 Elrod et al, EUP 572,220 |
| Thermo-elastic bend actuator | An actuator which relies upon differential thermal expansion upon Joule heating is used. | ♦ Low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents<br>♦ Standard MEMS processes can be used<br>♦ Easy extension from single nozzles to pagewidth print heads | ♦ Efficient aqueous operation requires a thermal insulator on the hot side<br>♦ Corrosion prevention can be difficult<br>♦ Pigmented inks may be infeasible, as pigment particles may jam the bend actuator | ♦ IJ03, IJ09, IJ17, IJ18<br>♦ IJ19, IJ20, IJ21, IJ22<br>♦ IJ23, IJ24, IJ27, IJ28<br>♦ IJ29, IJ30, IJ31, IJ32<br>♦ IJ33, IJ34, IJ35, IJ36<br>♦ IJ37, IJ38 ,IJ39, IJ40<br>♦ IJ41 |
| High CTE thermo-elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 μm long PTFE bend actuator with polysilicon heater and 15 mW power input can provide 180 μN force and 10 μm deflection. Actuator motions include:<br>1) Bend<br>2) Push<br>3) Buckle<br>4) Rotate | ♦ High force can be generated<br>♦ PTFE is a candidate for low dielectric constant insulation in ULSI<br>♦ Very low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents<br>♦ Easy extension from single nozzles to pagewidth print heads | ♦ Requires special material (e.g. PTFE)<br>♦ Requires a PTFE deposition process, which is not yet standard in ULSI fabs<br>♦ PTFE deposition cannot be followed with high temperature (above 350° C.) processing<br>♦ Pigmented inks may be infeasible, as pigment particles may jam the bend actuator | ♦ IJ09, IJ17, IJ18, IJ20<br>♦ IJ21, IJ22, IJ23, IJ24<br>♦ IJ27, IJ28, IJ29, IJ30<br>♦ IJ31, IJ42, IJ43, IJ44 |
| Conductive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated. Examples of conducting dopants include:<br>1) Carbon nanotubes<br>2) Metal fibers<br>3) Conductive polymers such as doped polythiophene<br>4) Carbon granules | ♦ High force can be generated<br>♦ Very low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents<br>♦ Easy extension from single nozzles to pagewidth print heads | ♦ Requires special materials development (High CTE conductive polymer)<br>♦ Requires a PTFE deposition process, which is not yet standard in ULSI fabs<br>♦ PTFE deposition cannot be followed with high temperature (above 350° C.) processing<br>♦ Evaporation and CVD deposition techniques cannot be used<br>♦ Pigmented inks may be infeasible, as pigment particles may jam the bend actuator | ♦ IJ24 |
| Shape memory alloy | A shape memory alloy such as TiNi (also known as Nitinol - Nickel Titanium alloy developed at the Naval Ordnance Laboratory) is thermally switched between its weak martensitic state and its high stiffness austenic state. The shape of the actuator in its martensitic state is deformed relative to the austenic shape. The shape change causes ejection of a drop. | ♦ High force is available (stresses of hundreds of MPa)<br>♦ Large strain is available (more than 3%)<br>♦ High corrosion resistance<br>♦ Simple construction<br>♦ Easy extension from single nozzles to pagewidth print heads<br>♦ Low voltage operation | ♦ Fatigue limits maximum number of cycles<br>♦ Low strain (1%) is required to extend fatigue resistance<br>♦ Cycle rate limited by heat removal<br>♦ Requires unusual materials (TiNi)<br>♦ The latent heat of transformation must be provided<br>♦ High current operation<br>♦ Requires pre-stressing to distort the martensitic state | ♦ IJ26 |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched | ♦ Linear Magnetic actuators can be constructed with high thrust, long travel, and high efficiency using planar semiconductor fabrication techniques | ♦ Requires unusual semiconductor materials such as soft magnetic alloys (e.g. CoNiFe [1])<br>♦ Some varieties also require permanent magnetic materials such as Neodymium iron boron (NdFeB) | ♦ IJ12 |

-continued

| | Reluctance Actuator (LSRA), and the Linear Stepper Actuator (LSA). | ♦ Long actuator travel is available<br>♦ Medium force is available<br>♦ Low voltage operation | ♦ Requires complex multi-phase drive circuitry<br>♦ High current operation | |

BASIC OPERATION MODE

| Operational mode | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | ♦ Simple operation<br>♦ No external fields required<br>♦ Satellite drops can be avoided if drop velocity is less than 4 m/s<br>♦ Can be efficient, depending upon the actuator used | ♦ Drop repetition rate is usually limited to less than 10 KHz. However, this is not fundamental to the method, but is related to the refill method normally used<br>♦ All of the drop kinetic energy must be provided by the actuator<br>♦ Satellite drops usually form if drop velocity is greater than 4.5 m/s | ♦ Thermal inkjet<br>♦ Piezoelectric inkjet<br>♦ IJ01, IJ02, IJ03, IJ04<br>♦ IJ05, IJ06, IJ07, IJ09<br>♦ IJ11, IJ12, IJ14, IJ16<br>♦ IJ20, IJ22, IJ23, IJ24<br>♦ IJ25, IJ26, IJ27, IJ28<br>♦ IJ29, IJ30, IJ31, IJ32<br>♦ IJ33, IJ34, IJ35, IJ36<br>♦ IJ37, IJ38, IJ39, IJ40<br>♦ IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | ♦ Very simple print head fabrication can be used<br>♦ The drop selection means does not need to provide the energy required to separate the drop from the nozzle | ♦ Requires close proximity between the print head and the print media or transfer roller<br>♦ May require two print heads printing alternate rows of the image<br>♦ Monolithic color print heads are difficult | ♦ Silverbrook, EP 0771 658 A2 and related patent applications |
| Electrostatic pull on ink | The drops to be printed are selected by some manner (e.g. thermally induced surface tension reduction of pressurized ink). Selected drops are separated from the ink in the nozzle by a strong electric field. | ♦ Very simple print head fabrication can be used<br>♦ The drop selection means does not need to provide the energy required to separate the drop from the nozzle | ♦ Requires very high electrostatic field<br>♦ Electrostatic field for small nozzle sizes is above air breakdown<br>♦ Electrostatic field may attract dust | ♦ Silverbrook, EP 0771 658 A2 and related patent applications<br>♦ Tone-Jet |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | ♦ Very simple print head fabrication can be used<br>♦ The drop selection means does not need to provide the energy required to separate the drop from the nozzle | ♦ Requires magnetic ink<br>♦ Ink colors other than black are difficult<br>♦ Requires very high magnetic fields | ♦ Silverbrook, EP 0771 658 A2 and related patent applications |
| Shutter | The actuator moves a shutter to block ink flow to the nozzle. The ink pressure is pulsed at a multiple of the drop ejection frequency. | ♦ High speed (>50 KHz) operation can be achieved due to reduced refill time<br>♦ Drop timing can be very accurate<br>♦ The actuator energy can be very low | ♦ Moving parts are required<br>♦ Requires ink pressure modulator<br>♦ Friction and wear must be considered<br>♦ Stiction is possible | ♦ IJ13, IJ17, IJ21 |
| Shuttered grill | The actuator moves a shutter to block ink flow through a grill to the nozzle. The shutter movement need only be equal to the width of the grill holes. | ♦ Actuators with small travel can be used<br>♦ Actuators with small force can be used<br>♦ High speed (>50 KHz) operation can be achieved | ♦ Moving parts are required<br>♦ Requires ink pressure modulator<br>♦ Friction and wear must be considered<br>♦ Stiction is possible | ♦ IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | ♦ Extremely low energy operation is possible<br>♦ No heat dissipation problems | ♦ Requires an external pulsed magnetic field<br>♦ Requires special materials for both the actuator and the ink pusher<br>♦ Complex construction | ♦ IJ10 |

AUXILIARY MECHANISM (APPLIED TO ALL NOZZLES)

| Auxiliary Mechanism | Description | Advantages | Disadvantages | Examples |
|---|---|---|---|---|
| None | The actuator directly fires the ink drop, and there is no external field or other mechanism required. | ♦ Simplicity of construction<br>♦ Simplicity of operation<br>♦ Small physical size | ♦ Drop ejection energy must be supplied by individual nozzle actuator | ♦ Most inkjets, including piezoelectric and |

-continued

| | | | | thermal bubble.<br>♦ IJ01–IJ07, IJ09, IJ11<br>♦ IJ12, IJ14, IJ20, IJ22<br>♦ IJ23–IJ45 |
|---|---|---|---|---|
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | ♦ Oscillating ink pressure can provide a refill pulse, allowing higher operating speed<br>♦ The actuators may operate with much lower energy<br>♦ Acoustic lenses can be used to focus the sound on the nozzles | ♦ Requires external ink pressure oscillator<br>♦ Ink pressure phase and amplitude must be carefully controlled<br>♦ Acoustic reflections in the ink chamber must be designed for | ♦ Silverbrook, EP 0771 658 A2 and related patent applications<br>♦ IJ08, IJ13, IJ15, IJ17<br>♦ IJ18, IJ19, IJ21 |
| Media proximity | The print head is placed in close proximity to the print medium. Selected drops protrude. from the print head further than unselected drops, and contact the print medium. The drop soaks into the medium fast enough to cause drop separation. | ♦ Low power<br>♦ High accuracy<br>♦ Simple print head construction | ♦ Precision assembly required<br>♦ Paper fiber's may cause problems<br>♦ Cannot print on rough substrates | ♦ Silverbrook, EP 0771 658 A2 and related patent applications |
| Transfer roller | Drops are printed to a transfer roller instead of straight to the print medium. A transfer roller can also be used for proximity drop separation. | ♦ High accuracy<br>♦ Wide range of print substrates can be used<br>♦ Ink can be dried on the transfer roller | ♦ Bulky<br>♦ Expensive<br>♦ Complex constriction | ♦ Silverbrook, EP 0771 658 A2 and related patent applications<br>♦ Tektronix hot melt piezoelectric inkjet<br>♦ Any of the IJ series |
| Electrostatic | An electric field is used to accelerate selected drops towards the print medium. | ♦ Low power<br>♦ Simple print head construction | ♦ Field strength required for separation of small drops is near or above air breakdown | ♦ Silverbrook, EP 0771 658 A2 and related patent applications<br>♦ Tone-jet |
| Direct magnetic field | A magnetic field is used to accelerate selected drops of magnetic ink towards the print medium. | ♦ Low power<br>♦ Simple print head construction | ♦ Requires magnetic ink<br>♦ Requires strong magnetic field | ♦ Silverbrook, EP 0771 658 A2 and related patent applications |
| Cross magnetic field | The print head is placed in a constant magnetic field. The Lorenz force in a current carrying wire is used to move the actuator. | ♦ Does not require magnetic materials to be integrated in the print head manufacturing process | ♦ Requires external magnet<br>♦ Current densities may be high, resulting in electromigration problems | ♦ IJ06, IJ16 |
| Pulsed magnetic field | A pulsed magnetic field is used to cyclically attract a paddle, which pushes on the ink. A small actuator moves a catch, which selectively prevents the paddle from moving. | ♦ Very low power operation is possible<br>♦ Small print head size | ♦ Complex print head construction<br>♦ Magnetic materials required in print head | ♦ IJ10 |

ACTUATOR AMPLIFICATION OR MODIFICATION METHOD

| Actuator amplification | Description | Advantages | Disadvantages | Examples |
|---|---|---|---|---|
| None | No actuator mechanical amplification is used. The actuator directly drives the drop ejection process. | ♦ Operational simplicity | ♦ Many actuator mechanisms have insufficient travel, or insufficient force, to efficiently drive the drop ejection process | ♦ Thermal Bubble Inkjet<br>♦ IJ01, IJ02, IJ06, IJ07<br>♦ IJ16, IJ25, IJ26 |
| Differential expansion bend actuator | An actuator material expands more on one side than on the other. The expansion may be thermal, piezoelectric, magnetostrictive, or other mechanism. | ♦ Provides greater travel in a reduced print head area<br>♦ The bend actuator converts a high force low travel actuator mechanism to high travel, lower force mechanism. | ♦ High stresses are involved<br>♦ Care must be taken that the materials do not delaminate<br>♦ Residual bend resulting from high temperature or high stress during formation | ♦ Piezoelectric<br>♦ IJ03, IJ09, IJ17–IJ24<br>♦ IJ27, IJ29–IJ39, IJ42,<br>♦ IJ43, IJ44 |
| Transient bend actuator | A trilayer bend actuator where the two outside layers are identical. This cancels bend due to ambient temperature and residual stress. The actuator only responds to transient heating of one side or the other. | ♦ Very good temperature stability<br>♦ High speed, as a new drop can be fired before heat dissipates<br>♦ Cancels residual stress of formation | ♦ High stresses are involved<br>♦ Care must be taken that the materials do not delaminate | ♦ IJ40, IJ41 |
| Actuator stack | A series of thin actuators are stacked. This can be appropriate where actuators require high electric field strength, such as electrostatic and piezoelectric actuators. | ♦ Increased travel<br>♦ Reduced drive voltage | ♦ Increased fabrication complexity<br>♦ Increased possibility of short circuits due to pinholes | ♦ Some piezoelectric ink jets<br>♦ IJ04 |

-continued

| | Description | Advantages | Disadvantages | Examples |
|---|---|---|---|---|
| Multiple actuators | Multiple smaller actuators are used simultaneously to move the ink. Each actuator need provide only a portion of the force required. | ◆ Increases the force available from an actuator<br>◆ Multiple actuators can be positioned to control ink flow accurately | ◆ Actuator forces may not add linearly, reducing efficiency | ◆ IJ12, IJ13, IJ18, IJ20<br>◆ IJ22, IJ28, IJ42, IJ43 |
| Linear Spring | A linear spring is used to transform a motion with small travel and high force into a longer travel, lower force motion. | ◆ Matches low travel actuator with higher travel requirements<br>◆ Non-contact method of motion transformation | ◆ Requires print head area for the spring | ◆ IJ15 |
| Reverse spring | The actuator loads a spring. When the actuator is turned off, the spring releases. This can reverse the force/distance curve of the actuator to make it compatible with the force/time requirements of the drop ejection. | ◆ Better coupling to the ink | ◆ Fabrication complexity<br>◆ High stress in the spring | ◆ IJ05, IJ11 |
| Coiled actuator | A bend actuator is coiled to provide greater travel in a reduced chip area. | ◆ Increases travel<br>◆ Reduces chip area<br>◆ Planar implementations are relatively easy to fabricate. | ◆ Generally restricted to planar implementations due to extreme fabrication difficulty in other orientations. | ◆ IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | ◆ Simple means of increasing travel of a bend actuator | ◆ Care must be taken not to exceed the elastic limit in the flexure area<br>◆ Stress distribution is very uneven<br>◆ Difficult to accurately model with finite element analysis | ◆ IJ10, IJ19, IJ33 |
| Gears | Gears can be used to increase travel at the expense of duration. Circular gears, rack and pinion, ratchets, and other gearing methods can be used. | ◆ Low force, low travel actuators can be used<br>◆ Can be fabricated using standard surface MEMS processes | ◆ Moving parts are required<br>◆ Several actuator cycles are required<br>◆ More complex drive electronics<br>◆ Complex construction<br>◆ Friction, friction, and wear are possible | ◆ IJ13 |
| Catch | The actuator controls a small catch. The catch either enables or disables movement of an ink pusher that is controlled in a bulk manner. | ◆ Very low actuator energy<br>◆ Very small actuator size | ◆ Complex construction<br>◆ Requires external force<br>◆ Unsuitable for pigmented inks | ◆ IJ10 |
| Buckle plate | A buckle plate can be used to change a slow actuator into a fast motion. It can also convert a high force, low travel actuator into a high travel, medium force motion. | ◆ Very fast movement achievable | ◆ Must stay within elastic limits of the materials for long device life<br>◆ High stresses involved<br>◆ Generally high power requirement | ◆ S. Hirata et al, "An Ink-jet Head . . . ", Proc. IEEE MEMS, Feb. 1996, pp 418–423.<br>◆ IJ18, IJ27 |
| Tapered magnetic pole | A tapered magnetic pole can increase travel at the expense of force. | ◆ Linearizes the magnetic force/distance curve | ◆ Complex construction | ◆ IJ14 |
| Lever | A lever and fulcrum is used to transform a motion with small travel and high force into a motion with longer travel and lower force. The lever can also reverse the direction of travel. | ◆ Matches low travel actuator with higher travel requirements<br>◆ Fulcrum area has no linear movement, and can be used for a fluid seal | ◆ High stress around the fulcrum | ◆ IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | ◆ High mechanical advantage<br>◆ The ratio of force to travel of the actuator can be matched to the nozzle requirements by varying the number of impeller vanes | ◆ Complex construction<br>◆ Unsuitable for pigmented inks | ◆ IJ28 |
| Acoustic lens | A refractive or diffractive (e.g. zone plate) acoustic lens is used to concentrate sound waves. | ◆ No moving parts | ◆ Large area required<br>◆ Only relevant for acoustic ink jets | ◆ 1993 Hadimioglu et al, EUP 550,192<br>◆ 1993 Elrod et al, EUP 572,220 |
| Sharp conductive point | A sharp point is used to concentrate an electrostatic field. | ◆ Simple construction | ◆ Difficult to fabricate using standard VLSI processes for a surface ejecting ink-jet<br>◆ Only relevant for electrostatic ink jets | ◆ Tone-jet |

ACTUATOR MOTION

| Actuator motion | Description | Advantages | Disadvantages | Examples |
|---|---|---|---|---|
| Volume expansion | The volume of the actuator changes, pushing the ink in all directions. | ◆ Simple construction in the case of thermal inkjet | ◆ High energy is typically required to achieve volume expansion. This leads to thermal stress, cavitation, and kogation in thermal ink jet implementations | ◆ Hewlett-Packard Thermal Inkjet<br>◆ Canon Bubblejet |

-continued

| | | | | |
|---|---|---|---|---|
| Linear, normal to chip surface | The actuator moves in a direction normal to the print head surface. The nozzle is typically in the line of movement. | ◆ Efficient coupling to ink drops ejected normal to the surface | ◆ High fabrication complexity may be required to achieve perpendicular motion | ◆ IJ01, IJ02, IJ04, IJ07<br>◆ IJ11, IJ14 |
| Linear, parallel to chip surface | The actuator moves parallel to the print head surface. Drop ejection may still be normal to the surface. | ◆ Suitable for planar fabrication | ◆ Fabrication complexity<br>◆ Friction<br>◆ Stiction | ◆ IJ12, IJ13, IJ15, IJ33,<br>◆ IJ34, IJ35, IJ36 |
| Membrane push | An actuator with a high force but small area is used to push a stiff membrane that is in contact with the ink. | ◆ The effective area of the actuator becomes the membrane area | ◆ Fabrication complexity<br>◆ Actuator size<br>◆ Difficulty of integration in a VLSI process | ◆ 1982 Howkins U.S. Pat. No. 4,459,601 |
| Rotary | The actuator causes the rotation of some element, such a grill or impeller | ◆ Rotary levers may be used to increase travel<br>◆ Small chip area requirements | ◆ Device complexity<br>◆ May have friction at a pivot point | ◆ IJ05, IJ08, IJ13, IJ28 |
| Bend | The actuator bends when energized. This may be due to differential thermal expansion, piezoelectric expansion, magnetostriction, or other form of relative dimensional change. | ◆ A very small change in dimensions can be converted to a large motion. | ◆ Requires the actuator to be made from at least two distinct layers, or to have a thermal difference across the actuator | ◆ 1970 Kyser et al U.S. Pat. No. 3,946,398<br>◆ 1973 Stemme U.S. Pat. No. 3,747,120<br>◆ IJ03, IJ09, IJ10, IJ19<br>◆ IJ23, IJ24, IJ25, IJ29<br>◆ IJ30, IJ31, IJ33, IJ34<br>◆ IJ35 |
| Swivel | The actuator swivels around a central pivot. This motion is suitable where there are opposite forces applied to opposite sides of the paddle, e.g. Lorenz force. | ◆ Allows operation where the net linear force on the paddle is zero<br>◆ Small chip area requirements | ◆ Inefficient coupling to the ink motion | ◆ IJ06 |
| Straighten | The actuator is normally bent, and straightens when energized. | ◆ Can be used with shape memory alloys where the austenic phase is planar | ◆ Requires careful balance of stresses to ensure that the quiescent bend is accurate | ◆ IJ26, IJ32 |
| Double bend | The actuator bends in one direction when one element is energized, and bends the other way when another element is energized. | ◆ One actuator can be used to power two nozzles.<br>◆ Reduced chip size.<br>◆ Not sensitive to ambient temperature | ◆ Difficult to make the drops ejected by both bend directions identical.<br>◆ A small efficiency loss compared to equivalent single bend actuators. | ◆ IJ36, IJ37, IJ38 |
| Shear | Energizing the actuator causes a shear motion in the actuator material. | ◆ Can increase the effective travel of piezoelectric actuators | ◆ Not readily applicable to other actuator mechanisms | ◆ 1985 Fishbeck U.S. Pat. No. 4,584,590 |
| Radial constriction | The actuator squeezes an ink reservoir, forcing ink from a constricted nozzle. | ◆ Relatively easy to fabricate single nozzles from glass tubing as macroscopic structures | ◆ High force required<br>◆ Inefficient<br>◆ Difficult to integrate with VLSI processes | ◆ 1970 Zoltan U.S. Pat. No. 3,683,212 |
| Coil/uncoil | A coiled actuator uncoils or coils more tightly. The motion of the free end of the actuator ejects the ink. | ◆ Easy to fabricate as a planar VLSI process<br>◆ Small area required, therefore low cost | ◆ Difficult to fabricate for non-planar devices<br>◆ Poor out-of-plane stiffness | ◆ IJ17, IJ21, IJ34, IJ35 |
| Bow | The actuator bows (or buckles) in the middle when energized. | ◆ Can increase the speed of travel<br>◆ Mechanically rigid | ◆ Maximum travel is constrained<br>◆ High force required | ◆ IJ16, IJ18, IJ27 |
| Push-Pull | Two actuators control a shutter. One actuator pulls the shutter, and the other pushes it. | ◆ The structure is pinned at both ends, so has a high out-of-plane rigidity | ◆ Not readily suitable for inkjets which directly push the ink | ◆ IJ18 |
| Curl inwards | A set of actuators curl inwards to reduce the volume of ink that they enclose. | ◆ Good fluid flow to the region behind the actuator increases efficiency | ◆ Design complexity | ◆ IJ20, IJ42 |
| Curl outwards | A set of actuators curl outwards, pressurizing ink in a chamber surrounding the actuators, and expelling ink from a nozzle in the chamber. | ◆ Relatively simple construction | ◆ Relatively large chip area | ◆ IJ43 |
| Iris | Multiple vanes enclose a volume of ink. These simultaneously rotate, reducing the volume between the vanes. | ◆ High efficiency<br>◆ Small chip area | ◆ High fabrication complexity<br>◆ Not suitable for pigmented inks | ◆ IJ22 |
| Acoustic vibration | The actuator vibrates at a high frequency. | ◆ The actuator can be physically distant from the ink | ◆ Large area required for efficient operation at useful frequencies<br>◆ Acoustic coupling and crosstalk<br>◆ Complex drive circuitry<br>◆ Poor control of drop volume and position | ◆ 1993 Hadimioglu et al, EUP 550,192<br>◆ 1993 Elrod et al, EUP 572,220 |

-continued

| | | | | |
|---|---|---|---|---|
| None | In various ink jet designs the actuator does not move. | ◆ No moving parts | ◆ Various other tradeoffs are required to eliminate moving parts | ◆ Silverbrook, EP 0771 658 A2 and related patent applications<br>◆ Tone-jet |

NOZZLE REFILL METHOD

| Nozzle refill method | Description | Advantages | Disadvantages | Examples |
|---|---|---|---|---|
| Surface tension | After the actuator is energized, it typically returns rapidly to its normal position. This rapid return sucks in air through the nozzle opening. The ink surface tension at the nozzle then exerts a small force restoring the meniscus to a minimum area. | ◆ Fabrication simplicity<br>◆ Operational simplicity | ◆ Low speed<br>◆ Surface tension force relatively small compared to actuator force<br>◆ Long refill time usually dominates the total repetition rate | ◆ Thermal inkjet<br>◆ Piezoelectric inkjet<br>◆ IJ01–IJ07, IJ10–IJ14<br>◆ IJ16, IJ20, IJ22–IJ45 |
| Shuttered oscillating ink pressure | Ink to the nozzle chamber is provided at a pressure that oscillates at twice the drop ejection frequency. When a drop is to be ejected, the shutter is opened for 3 half cycles: drop ejection, actuator return, and refill. | ◆ High speed<br>◆ Low actuator energy, as the actuator need only open or close the shutter, instead of ejecting the ink drop | ◆ Requires common ink pressure oscillator<br>◆ May not be suitable for pigmented inks | ◆ IJ08, IJ13, IJ15, IJ17<br>◆ IJ18, IJ19, IJ21 |
| Refill actuator | After the main actuator has ejected a drop a second (refill) actuator is energized. The refill actuator pushes ink into the nozzle chamber. The refill actuator returns slowly, to prevent its return from, emptying the chamber again. | ◆ High speed, as the nozzle is actively refilled | ◆ Requires two independent actuators per nozzle | ◆ IJ09 |
| Positive ink pressure | The ink is held a slight positive pressure. After the ink drop is ejected, the nozzle chamber fills quickly as surface tension and ink pressure both operate to refill the nozzle. | ◆ High refill rate, therefore a high drop repetition rate is possible | ◆ Surface spill must be prevented<br>◆ Highly hydrophobic print head surfaces are required | ◆ Silverbrook, EP 0771 658 A2 and related patent applications<br>◆ Alternative for:<br>◆ IJ01–IJ07, IJ10–IJ14<br>◆ IJ16, IJ20, IJ22–IJ45 |

METHOD OF RESTRICTING BACK-FLOW THROUGH INLET

| Inlet back-flow restriction method | Description | Advantages | Disadvantages | Examples |
|---|---|---|---|---|
| Long inlet channel | The ink inlet channel to the nozzle chamber is made long and, relatively narrow, relying on viscous drag to reduce inlet back-flow. | ◆ Design simplicity<br>◆ Operational simplicity<br>◆ Reduces crosstalk | ◆ Restricts refill rate<br>◆ May result in a relatively large chip area<br>◆ Only partially effective | ◆ Thermal inkjet<br>◆ Piezoelectric inkjet<br>◆ IJ42, IJ43 |
| Positive ink pressure | The ink is under a positive pressure, so that in the quiescent state some of the ink drop already protrudes from the nozzle.<br>This reduces the pressure in the nozzle chamber which is required to eject a certain volume of ink. The reduction in chamber pressure results in a reduction in ink pushed out through the inlet. | ◆ Drop selection and separation forces can be reduced<br>◆ Fast refill time | ◆ Requires a method (such as a nozzle rim or effective hydrophobizing, or both) to prevent flooding of the ejection surface of the print head. | ◆ Silverbrook, EP 0771 658 A2 and related patent applications<br>◆ Possible operation of the following:<br>◆ IJ01–IJ07, IJ09–IJ12<br>◆ IJ14, IJ16, IJ20, IJ22,<br>◆ IJ23–IJ34, IJ36–IJ41<br>◆ IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | ◆ The refill rate is not as restricted as the long inlet method.<br>◆ Reduces crosstalk | ◆ Design complexity<br>◆ May increase fabrication complexity (e.g. Tektronix hot melt Piezoelectric print heads). | ◆ HP Thermal Ink Jet<br>◆ Tektronix piezoelectric ink jet |
| Flexible flap restricts inlet | In this method recently disclosed by Canon, the expanding actuator (bubble) pushes on a flexible flap that restricts the inlet. | ◆ Significantly reduces back-flow for edge-shooter thermal ink jet devices | ◆ Not applicable to most inkjet configurations<br>◆ Increased fabrication complexity<br>◆ Inelastic deformation of polymer flap results in creep over extended use | ◆ Canon |

-continued

| | Description | Advantages | Disadvantages | Examples |
|---|---|---|---|---|
| Inlet filter | A filter is located between the ink inlet and the nozzle chamber. The filter has a multitude of small holes or slots, restricting ink flow. The filter also removes particles which may block the nozzle. | ◆ Additional advantage of ink filtration<br>◆ Ink filter may be fabricated with no additional process steps | ◆ Restricts refill rate<br>◆ May result in complex construction | ◆ IJ04, IJ12, IJ24, IJ27<br>◆ IJ29, IJ30 |
| Small inlet compared to nozzle | The ink inlet channel to the nozzle chamber has a substantially smaller cross section than that of the nozzle, resulting in easier ink egress out of the nozzle than out of the inlet. | ◆ Design simplicity | ◆ Restricts refill rate<br>◆ May result in a relatively large chip area<br>◆ Only partially effective | ◆ IJ02, IJ37, IJ44 |
| Inlet shutter | A secondary actuator controls the position of a shutter, closing off the ink inlet when the main actuator is energized. | ◆ Increases speed of the ink-jet print head operation | ◆ Requires separate refill actuator and drive circuit | ◆ IJ09 |
| The inlet is located behind the ink-pushing surface | The method avoids the problem of inlet back-flow by arranging the ink-pushing surface of the actuator between the inlet and the nozzle. | ◆ Back-flow problem is eliminated | ◆ Requires careful design to minimize the negative pressure behind the paddle | ◆ IJ01, IJ03, IJ05, IJ06<br>◆ IJ07, IJ10, IJ11, IJ14<br>◆ IJ16, IJ22, IJ23, IJ25<br>◆ IJ28, IJ31, IJ32, IJ33<br>◆ IJ34, IJ35, IJ36, IJ39<br>◆ IJ40, IJ41 |
| Part of the actuator moves to shut off the inlet | The actuator and a wall of the ink chamber are arranged so that the motion of the actuator closes off the inlet. | ◆ Significant reductions in back-flow can be achieved<br>◆ Compact designs possible | ◆ small increase in fabrication complexity | ◆ IJ07, IJ20, IJ26, IJ38 |
| Nozzle actuator does not result in ink back-flow | In some configurations of ink jet, there is no expansion or movement of an actuator which may cause ink back-flow through the inlet. | ◆ Ink back-flow problem is eliminated | ◆ None related to ink back-flow on actuation | ◆ Silverbrook, EP 0771 658 A2 and related patent applications<br>◆ Valve-jet<br>◆ Tone-jet<br>◆ IJ08, IJ13, IJ15, IJ17<br>◆ IJ18, IJ19, IJ21 |

NOZZLE CLEARING METHOD

| Nozzle Clearing method | Description | Advantages | Disadvantages | Examples |
|---|---|---|---|---|
| Normal nozzle firing | All of the nozzles are fired periodically, before the ink has a chance to dry. When not in use the nozzles are sealed (capped) against air.<br>The nozzle firing is usually performed during a special clearing cycle, after first moving the print head to a cleaning station. | ◆ No added complexity on the print head | ◆ May not be sufficient to displace dried ink | ◆ Most ink jet systems<br>◆ IJ01–IJ07, IJ09–IJ12<br>◆ IJ14, IJ16, IJ20, IJ22<br>◆ IJ23–IJ34, IJ36–IJ45 |
| Extra power to ink heater | In systems which heat the ink, but do not boil it under normal, situations, nozzle clearing can be achieved by over-powering the heater and boiling ink at the nozzle. | ◆ Can be highly effective if the heater is adjacent to the nozzle | ◆ Requires higher drive voltage for clearing<br>◆ May require larger drive transistors | ◆ Silverbrook, EP 0771 658 A2 and related patent applications |
| Rapid succession of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | ◆ Does not require extra drive circuits on the print head<br>◆ Can be readily controlled and initiated by digital logic | ◆ Effectiveness depends substantially upon the configuration of the inkjet nozzle | ◆ May be used with:<br>◆ IJ01–IJ07, IJ09–IJ11<br>◆ IJ14, IJ16, IJ20, IJ22<br>◆ IJ23–IJ25, IJ27–IJ34<br>◆ IJ36–IJ45 |
| Extra power to ink pushing actuator | Where an actuator is not normally driven to the limit of its motion, nozzle clearing may be assisted by providing an enhanced drive signal to the actuator. | ◆ A simple solution where applicable | ◆ Not suitable where there is a hard limit to actuator movement | ◆ May be used with:<br>◆ IJ03, IJ09, IJ16, IJ20<br>◆ IJ23, IJ24, IJ25, IJ27<br>◆ IJ29, IJ30, IJ31, IJ32<br>◆ IJ39, IJ40, IJ41, |

-continued

| | | | | IJ42<br>♦ IJ43, IJ44, IJ45 |
|---|---|---|---|---|
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | ♦ A high nozzle clearing capability can be achieved<br>♦ May be implemented at very low cost in systems which already include acoustic actuators | ♦ High implementation cost if system does not already include an acoustic actuator | ♦ IJ08, IJ13, IJ15, IJ17<br>♦ IJ18, IJ19, IJ21 |
| Nozzle clearing plate | A microfabricated plate is pushed against the nozzles. The plate has a post for every nozzle. The array of posts | ♦ Can clear severely clogged nozzles | ♦ Accurate mechanical alignment is required<br>♦ Moving parts are required<br>♦ There is risk of damage to the nozzles<br>♦ Accurate fabrication is required | ♦ Silverbrook, EP 0771 658 A2 and related patent applications |
| Ink pressure pulse | The pressure of the ink is temporarily increased so that ink streams from all of the nozzles. This may be used in conjunction with actuator energizing. | ♦ May be effective where other methods cannot be used | ♦ Requires pressure pump or other pressure actuator<br>♦ Expensive<br>♦ Wasteful of ink | ♦ May be used with all IJ series ink jets |
| Print head wiper | A flexible 'blade' is wiped across the print head surface. The blade is usually fabricated from a flexible polymer, e.g. rubber or synthetic elastomer. | ♦ Effective for planar print head surfaces<br>♦ Low cost | ♦ Difficult to use if print head surface is non-planar or very fragile<br>♦ Requires mechanical parts<br>♦ Blade can wear out in high volume print systems | ♦ Many ink jet systems |
| Separate ink boiling heater | A separate heater is provided at the nozzle although the normal drop e-ection mechanism does not require it. The heaters do not require individual drive circuits, as many nozzles can be cleared simultaneously, and no imaging is required. | ♦ Can be effective where other nozzle clearing methods cannot be used<br>♦ Can be implemented at no additional cost in some inkjet configurations | ♦ Fabrication complexity | ♦ Can be used with many IJ series ink jets |

NOZZLE PLATE CONSTRUCTION

| Nozzle plate construction | Description | Advantages | Disadvantages | Examples |
|---|---|---|---|---|
| Electro-formed nickel | A nozzle plate is separately fabricated from electroformed nickel, and bonded to the print head chip. | ♦ Fabrication simplicity | ♦ High temperatures and pressures are required to bond nozzle plate<br>♦ Minimum thickness constraints<br>♦ Differential thermal expansion | ♦ Hewlett Packard Thermal Inkjet |
| Laser ablated or drilled polymer | Individual nozzle holes are ablated by an intense UV laser in a nozzle plate, which is typically a polymer such as polyimide or polysulphone | ♦ No masks required<br>♦ Can be quite fast<br>♦ Some control over nozzle profile is possible<br>♦ Equipment required is relatively low cost | ♦ Each hole must be individually formed<br>♦ Special equipment required<br>♦ Slow where there are many thousands of nozzles per print head<br>♦ May produce thin burrs at exit holes | ♦ Canon Bubblejet<br>♦ 1988 Sercel et al., SPIE, Vol. 998 Excimer Beam Applications, pp. 76–83<br>♦ 1993 Watanabe et al., U.S. Pat. No. 5,208,604 |
| Silicon micro-machined | A separate nozzle plate is micromachined from single crystal silicon, and bonded to the print head wafer. | ♦ High accuracy is attainable | ♦ Two part construction<br>♦ High cost<br>♦ Requires precision alignment<br>♦ Nozzles may be clogged by adhesive | ♦ K. Bean, IEEE Transactions on Electron Devices, Vol. ED-25, No 10, 1978, pp 1185–1195<br>♦ Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | ♦ No expensive equipment required<br>♦ Simple to make single nozzles | ♦ Very small nozzle sizes are difficult to form<br>♦ Not suited for mass production | ♦ 1970 Zoltan U.S. Pat. No. 3,683,212 |
| Monolithic, surface micro-machined using VLSI lithographic processes | The nozzle plate is deposited as a layer using standard VLSI deposition techniques. Nozzles are etched in the nozzle plate using VLSI lithography and etching. | ♦ High accuracy (<1 $\mu$m)<br>♦ Monolithic<br>♦ Low cost<br>♦ Existing processes can be used | ♦ Requires sacrificial layer under the nozzle plate to form the nozzle chamber<br>♦ Surface may be fragile to the touch | ♦ Silverbrook, EP 0771 658 A2 and related patent applications<br>♦ IJ01, IJ02, IJ04, IJ11<br>♦ IJ12, IJ17, IJ18, IJ20<br>♦ IJ22, IJ24, IJ27, IJ28<br>♦ IJ29, IJ30, IJ31, IJ32<br>♦ IJ33, IJ34, IJ36, IJ37 |

-continued

| | | | | |
|---|---|---|---|---|
| | | | | ◆ IJ38, IJ39, IJ40, IJ41<br>◆ IJ42, IJ43, IJ44 |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | ◆ High accuracy (<1 μm)<br>◆ Monolithic<br>◆ Low cost<br>◆ No differential expansion | ◆ Requires long etch times<br>◆ Requires a support wafer | ◆ IJ03, IJ05, IJ06, IJ07<br>◆ IJ08, IJ09, IJ10, IJ13<br>◆ IJ14, IJ15, IJ16, IJ19<br>◆ IJ21, IJ23, IJ25, IJ26 |
| No nozzle plate | Various methods have been tried to eliminate the nozzles entirely, to prevent nozzle clogging. These include thermal bubble mechanisms and acoustic lens mechanisms | ◆ No nozzles to become clogged | ◆ Difficult to control drop position accurately<br>◆ Crosstalk problems | ◆ Ricoh 1995 Sekiya et al U.S. Pat. No. 5,412,413<br>◆ 1993 Hadimioglu et al EUP 550,192<br>◆ 1993 Elrod et al EUP 572,220 |
| Trough | Each drop ejector has a trough through which a paddle moves. There is no nozzle plate. | ◆ Reduced manufacturing complexity<br>◆ Monolithic | ◆ Drop firing direction is sensitive to wicking. | ◆ IJ35 |
| Nozzle slit instead of individual nozzles | The elimination of nozzle holes and replacement by a slit encompassing many actuator positions reduces nozzle clogging, but increases crosstalk due to ink surface waves | ◆ No nozzles to become clogged | ◆ Difficult to control drop position accurately<br>◆ Crosstalk problems | ◆ 1989 Saito et al U.S. Pat. No. 4,799,068 |

DROP EJECTION DIRECTION

| Ejection direction | Description | Advantages | Disadvantages | Examples |
|---|---|---|---|---|
| Edge ('edge shooter') | Ink flow is along the surface of the chip, and ink drops are ejected from the chip edge. | ◆ Simple construction<br>◆ No silicon etching required<br>◆ Good heat sinking via substrate<br>◆ Mechanically strong<br>◆ Ease of chip handing | ◆ Nozzles limited to edge<br>◆ High resolution is difficult<br>◆ Fast color printing requires one print head per color | ◆ Canon Bubblejet 1979 Endo et al GB patent 2,007,162<br>◆ Xerox heater-in-pit 1990 Hawkins et al U.S. Pat. No. 4,899,181<br>◆ Tone-jet |
| Surface ('roof shooter') | Ink flow is along the surface of the chip, and ink drops are ejected from the chip surface, normal to the plane of the chip. | ◆ No bulk silicon etching required<br>◆ Silicon can make an effective heat sink<br>◆ Mechanical strength | ◆ Maximum ink flow is severely restricted | ◆ Hewlett-Packard TIJ 1982 Vaught et al U.S. Pat. No. 4,490,728<br>◆ IJ02, IJ11, IJ12, IJ20<br>◆ IJ22 |
| Through chip, forward ('up shooter') | Ink flow is through the chip, and ink drops are ejected from the front surface of the chip. | ◆ High ink flow<br>◆ Suitable for pagewidth print<br>◆ High nozzle packing density therefore low manufacturing cost | ◆ Requires bulk silicon etching | ◆ Silverbrook, EP 0771 658 A2 and related patent applications<br>◆ IJ04, IJ17, IJ18, IJ24<br>◆ IJ27–IJ45 |
| Through chip, reverse ('down shooter') | Ink flow is through the chip, and ink drops are ejected from the rear surface of the chip. | ◆ High ink flow<br>◆ Suitable for pagewidth print<br>◆ High nozzle packing density therefore low manufacturing cost | ◆ Requires wafer thinning<br>◆ Requires special handling during manufacture | ◆ IJ01, IJ03, IJ05, IJ06<br>◆ IJ07, IJ08, IJ09, IJ10<br>◆ IJ13, IJ14, IJ15, IJ16<br>◆ IJ19, IJ21, IJ23, IJ25<br>◆ IJ26 |
| Through actuator | Ink flow is through the actuator, which is not fabricated as part of the same substrate as the drive transistors. | ◆ Suitable for piezoelectric print heads | ◆ Pagewidth print heads require several thousand connections to drive circuits<br>◆ Cannot be manufactured ip standard CMOS fabs<br>◆ Complex assembly required | ◆ Epson Stylus<br>◆ Tektronix hot melt piezoelectric ink jets |

INK TYPE

| Ink type | Description | Advantages | Disadvantages | Examples |
|---|---|---|---|---|
| Aqueous, dye | Water based ink which typically contains: water, dye, surfactant, humectant, and biocide. Modern ink dyes have high water-fastness, light fastness | ◆ Environmentally friendly<br>◆ No odor | ◆ Slow drying<br>◆ Corrosive<br>◆ Bleeds on paper<br>◆ May strikethrough<br>◆ Cockles paper | ◆ Most existing inkjets<br>◆ All IJ series ink jets<br>◆ Silverbrook, EP 0771 658 A2 and |

-continued

| | | | | |
|---|---|---|---|---|
| Aqueous, pigment | Water based ink which typically contains: water, pigment, surfactant, humectant, and biocide. Pigments have an advantage in reduced bleed, wicking and strikethrough. | ◆ Environmentally friendly<br>◆ No odor<br>◆ Reduced bleed<br>◆ Reduced wicking<br>◆ Reduced strikethrough | ◆ Slow drying<br>◆ Corrosive<br>◆ Pigment may clog nozzles<br>◆ Pigment may clog actuator mechanisms<br>◆ Cockles paper | ◆ IJ02, IJ04, IJ21, IJ26<br>◆ IJ27, IJ30<br>◆ Silverbrook, EP 0771 658 A2 and related patent applications<br>◆ Piezoelectric ink-jets<br>◆ Thermal ink jets (with significant restrictions) |
| Methyl Ethyl Ketone (MEK) | MEK is a highly volatile solvent used for industrial printing on difficult surfaces such as aluminum cans. | ◆ Very fast drying<br>◆ Prints on various substrates such as metals and plastics | ◆ Odorous<br>◆ Flammable | ◆ All IJ series ink jets |
| Alcohol (ethanol, 2-butanol, and others) | Alcohol based inks can be used where the printer must operate at temperatures below the freezing point of water. An example of this is in-camera consumer photographic printing. | ◆ Fast drying<br>◆ Operates at sub-freezing temperatures<br>◆ Reduced paper cockle<br>◆ Low cost | ◆ Slight odor<br>◆ Flammable | ◆ All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | ◆ No drying time- ink instantly freezes on the print medium<br>◆ Almost any print medium can be used<br>◆ No paper cockle occurs<br>◆ No wicking occurs<br>◆ No bleed occurs<br>◆ No strikethrough occurs | ◆ High viscosity<br>◆ Printed ink typically has a 'waxy' feel<br>◆ Printed pages may 'block'<br>◆ Ink temperature may be above the curie point of permanent magnets<br>◆ Ink heaters consume power<br>◆ Long warm-up time | ◆ Tektronix hot melt piezoelectric ink jets<br>◆ 1989 Nowak U.S. Pat. No. 4,820,346<br>◆ All IJ series ink jets |
| Oil | Oil based inks are extensively used in offset printing. They have advantages in improved characteristics on paper (especially no wicking or cockle). Oil soluble dies and pigments are required. | ◆ High solubility medium for some dyes<br>◆ Does not cockle paper<br>◆ Does not wick through paper | ◆ High viscosity: this is a significant limitation for use in inkjets, which usually require a low viscosity. Some short chain and multi-branched oils have a sufficiently low viscosity.<br>◆ Slow drying | ◆ All IJ series ink jets |
| Micro-emulsion | A microemulsion is a stable, self forming emulsion of oil, water, and surfactant. The characteristic drop size is less than 100 nm, and is determined by the preferred curvature of the surfactant. | ◆ Stops ink bleed<br>◆ High dye solubility<br>◆ Water, oil, and amphiphilic soluble dies can be used<br>◆ Can stabilize pigment suspensions | ◆ Viscosity higher than water<br>◆ Cost is slightly higher than water based ink<br>◆ High surfactant concentration required (around 5%) | ◆ All IJ series inkjets |

-continued

| Australian Provisional Number | Filing Date | Title |
|---|---|---|
| PO7935 | 15-Jul-97 | A Method of Manufacture of an Image Creation Apparatus (IJM01) |
| PO7936 | 15-Jul-97 | A Method of Manufacture of an Image Creation Apparatus (IJM02) |
| PO7937 | 15-Jul-97 | A Method of Manufacture of an Image Creation Apparatus (IJM03) |
| PO8061 | 15-Jul-97 | A Method of Manufacture of an Image Creation Apparatus (IJM04) |
| PO8054 | 15-Jul-97 | A Method of Manufacture of an Image Creation Apparatus (IJM05) |
| PO8065 | 15-Jul-97 | A Method of Manufacture of an Image Creation Apparatus (IJM06) |
| PO8055 | 15-Jul-97 | A Method of Manufacture of an Image Creation Apparatus (IJM07) |
| PO8053 | 15-Jul-97 | A Method of Manufacture of an Image Creation Apparatus (IJM08) |
| PO8078 | 15-Jul-97 | A Method of Manufacture of an Image Creation Apparatus (IJM09) |
| PO7933 | 15-Jul-97 | A Method of Manufacture of an Image Creation Apparatus (IJM10) |
| PO7950 | 15-Jul-97 | A Method of Manufacture of an Image Creation Apparatus (IJM11) |
| PO7949 | 15-Jul-97 | A Method of Manufacture of an Image Creation Apparatus (IJM12) |
| PO8060 | 15-Jul-97 | A Method of Manufacture of an Image Creation Apparatus (IJM13) |
| PO8059 | 15-Jul-97 | A Method of Manufacture of an Image Creation Apparatus (IJM14) |
| PO8073 | 15-Jul-97 | A Method of Manufacture of an Image Creation Apparatus (IJM15) |
| PO8076 | 15-Jul-97 | A Method of Manufacture of an Image Creation Apparatus (IJM16) |
| PO8075 | 15-Jul-97 | A Method of Manufacture of an Image Creation Apparatus (IJM17) |
| PO8079 | 15-Jul-97 | A Method of Manufacture of an Image Creation Apparatus (IJM18) |
| PO8050 | 15-Jul-97 | A Method of Manufacture of an Image Creation Apparatus (IJM19) |
| PO8052 | 15-Jul-97 | A Method of Manufacture of an Image Creation Apparatus (IJM20) |
| PO7948 | 15-Jul-97 | A Method of Manufacture of an Image Creation Apparatus (IJM21) |
| PO7951 | 15-Jul-97 | A Method of Manufacture of an Image Creation Apparatus (IJM22) |
| PO8074 | 15-Jul-97 | A Method of Manufacture of an Image Creation Apparatus (IJM23) |

-continued

| Australian Provisional Number | Filing Date | Title |
|---|---|---|
| PO7941 | 15-Jul-97 | A Method of Manufacture of an Image Creation Apparatus (IJM24) |
| PO8077 | 15-Jul-97 | A Method of Manufacture of an Image Creation Apparatus (IJM25) |
| PO8058 | 15-Jul-97 | A Method of Manufacture of an Image Creation Apparatus (IJM26) |
| PO8051 | 15-Jul-97 | A Method of Manufacture of an Image Creation Apparatus (IJM27) |
| PO8045 | 15-Jul-97 | A Method of Manufacture of an Image Creation Apparatus (IJM28) |
| PO7952 | 15-Jul-97 | A Method of Manufacture of an Image Creation Apparatus (IJM29) |
| PO8046 | 15-Jul-97 | A Method of Manufacture of an Image Creation Apparatus (IJM30) |
| PO8503 | 11-Aug-97 | A Method of Manufacture of an Image Creation Apparatus (IJM30a) |
| PO9390 | 23-Sep-97 | A Method of Manufacture of an Image Creation Apparatus (IJM31) |
| PO9392 | 23-Sep-97 | A Method of Manufacture of an Image Creation Apparatus (IJM32) |
| PP0889 | 12-Dec-97 | A Method of Manufacture of an Image Creation Apparatus (IJM35) |
| PP0887 | 12-Dec-97 | A Method of Manufacture of an Image Creation Apparatus (IJM36) |
| PP0882 | 12-Dec-97 | A Method of Manufacture of an Image Creation Apparatus (IJM37) |
| PP0874 | 12-Dec-97 | A Method of Manufacture of an Image Creation Apparatus (IJM38) |
| PP1396 | 19-Jan-98 | A Method of Manufacture of an Image Creation Apparatus (IJM39) |
| PP2591 | 25-Mar-98 | A Method of Manufacture of an Image Creation Apparatus (IJM41) |
| PP3989 | 9-Jun-98 | A Method of Manufacture of an Image Creation Apparatus (IJM40) |
| PP3990 | 9-Jun-98 | A Method of Manufacture of an Image Creation Apparatus (IJM42) |
| PP3986 | 9-Jun-98 | A Method of Manufacture of an Image Creation Apparatus (IJM43) |
| PP3984 | 9-Jun-98 | A Method of Manufacture of an Image Creation Apparatus (IJM44) |
| PP3982 | 9-Jun-98 | A Method of Manufacture of an Image Creation Apparatus (IJM45) |
| PO8003 | 15-Jul-97 | Supply Method and Apparatus (F1) |
| PO8005 | 15-Jul-97 | Supply Method and Apparatus (F2) |
| PO9404 | 23-Sep-97 | A Device and Method (F3) |
| PO7943 | 15-Jul-97 | A device (MEMS01) |
| PO8006 | 15-Jul-97 | A device (MEMS02) |
| PO8007 | 15-Jul-97 | A device (MEMS03) |
| PO8008 | 15-Jul-97 | A device (MEMS04) |
| PO8010 | 15-Jul-97 | A device (MEMS05) |
| PO8011 | 15-Jul-97 | A device (MEMS06) |
| PO7947 | 15-Jul-97 | A device (MEMS07) |
| PO7945 | 15-Jul-97 | A device (MEMS08) |
| PO7944 | 15-Jul-97 | A device (MEMS09) |
| PO7946 | 15-Jul-97 | A device (MEMS10) |
| PO9393 | 23-Sep-97 | A Device and Method (MEMS11) |
| PP0875 | 12-Dec-97 | A Device (MEMS12) |
| PP0894 | 12-Dec-97 | A Device and Method (MEMS13) |
| PP0895 | 12-Dec-97 | An Image Creation Method and Apparatus (IR01) |
| PP0870 | 12-Dec-97 | A Device and Method (IR02) |
| PP0869 | 12-Dec-97 | A Device and Method (IR04) |
| PP0887 | 12-Dec-97 | Image Creation Method and Apparatus (IR05) |
| PP0885 | 12-Dec-97 | An Image Production System (IR06) |
| PP0884 | 12-Dec-97 | Image Creation Method and Apparatus (IR10) |
| PP0886 | 12-Dec-97 | Image Creation Method and Apparatus (IR12) |
| PP0871 | 12-Dec-97 | A Device and Method (IR13) |
| PP0876 | 12-Dec-97 | An Image Processing Method and Apparatus (IR14) |
| PP0877 | 12-Dec-97 | A Device and Method (IR16) |
| PP0878 | 12-Dec-97 | A Device and Method (IR17) |
| PP0879 | 12-Dec-97 | A Device and Method (IR18) |
| PP0883 | 12-Dec-97 | A Device and Method (IR19) |
| PP0880 | 12-Dec-97 | A Device and Method (IR20) |
| PP0881 | 12-Dec-97 | A Device and Method (IR21) |
| PP2370 | 16-Mar-98 | Data Processing Method and Apparatus (Dot01) |
| PP2371 | 16-Mar-98 | Data Processing Method and Apparatus (Dot02) |
| PO7991 | 15-Jul-97 | Image Processing Method and Apparatus (ART01) |
| PO8505 | 11-Aug-97 | Image Processing Method and Apparatus (ART01a) |
| PO7988 | 15-Jul-97 | Image Processing Method and Apparatus (ART02) |
| PO7993 | 15-Jul-97 | Image Processing Method and Apparatus (ART03) |
| PO8012 | 15-Jul-97 | Image Processing Method and Apparatus (ART05) |
| PO8017 | 15-Jul-97 | Image Processing Method and Apparatus (ART06) |
| PO8014 | 15-Jul-97 | Media Device (ART07) |
| PO8025 | 15-Jul-97 | Image Processing Method and Apparatus (ART08) |
| PO8032 | 15-Jul-97 | Image Processing Method and Apparatus (ART09) |
| PO7999 | 15-Jul-97 | Image Processing Method and Apparatus (ART10) |
| PO7998 | 15-Jul-97 | Image Processing Method and Apparatus (ART11) |
| PO8031 | 15-Jul-97 | Image Processing Method and Apparatus (ART12) |
| PO8030 | 15-Jul-97 | Media Device (ART13) |
| PO8498 | 11-Aug-97 | Image Processing Method and Apparatus (ART14) |
| PO7997 | 15-Jul-97 | Media Device (ART15) |
| PO7979 | 15-Jul-97 | Media Device (ART16) |
| PO8015 | 15-Jul-97 | Media Device (ART17) |
| PO7978 | 15-Jul-97 | Media Device (ART18) |
| PO7982 | 15-Jul-97 | Data Processing Method and Apparatus (ART19) |
| PO7989 | 15-Jul-97 | Data Processing Method and Apparatus (ART20) |
| PO8019 | 15-Jul-97 | Media Processing Method and Apparatus (ART21) |
| PO7980 | 15-Jul-97 | Image Processing Method and Apparatus (ART22) |
| PO7942 | 15-Jul-97 | Image Processing Method and Apparatus (ART23) |
| PO8018 | 15-Jul-97 | Image Processing Method and Apparatus (ART24) |
| PO7938 | 15-Jul-97 | Image Processing Method and Apparatus (ART25) |
| PO8016 | 15-Jul-97 | Image Processing Method and Apparatus (ART26) |
| PO8024 | 15-Jul-97 | Image Processing Method and Apparatus (ART27) |
| PO7940 | 15-Jul-97 | Data Processing Method and Apparatus (ART28) |
| PO7939 | 15-Jul-97 | Data Processing Method and Apparatus (ART29) |
| PO8501 | 11-Aug-97 | Image Processing Method and Apparatus (ART30) |
| PO8500 | 11-Aug-97 | Image Processing Method and Apparatus (ART31) |
| PO7987 | 15-Jul-97 | Data Processing Method and Apparatus (ART32) |
| PO8022 | 15-Jul-97 | Image Processing Method and Apparatus (ART33) |
| PO8497 | 11-Aug-97 | Image Processing Method and Apparatus (ART30) |
| PO8029 | 15-Jul-97 | Sensor Creation Method and Apparatus (ART36) |
| PO7985 | 15-Jul-97 | Data Processing Method and Apparatus (ART37) |
| PO8020 | 15-Jul-97 | Data Processing Method and Apparatus (ART38) |

-continued

| Australian Provisional Number | Filing Date | Title |
|---|---|---|
| PO8023 | 15-Jul-97 | Data Processing Method and Apparatus (ART39) |
| PO9395 | 23-Sep-97 | Data Processing Method and Apparatus (ART4) |
| PO8021 | 15-Jul-97 | Data Processing Method and Apparatus (ART40) |
| PO8504 | 11-Aug-97 | Image Processing Method and Apparatus (ART42) |
| PO8000 | 15-Jul-97 | Data Processing Method and Apparatus (ART43) |
| PO7977 | 15-Jul-97 | Data Processing Method and Apparatus (ART44) |
| PO7934 | 15-Jul-97 | Data Processing Method and Apparatus (ART45) |
| PO7990 | 15-Jul-97 | Data Processing Method and Apparatus (ART46) |
| PO8499 | 11-Aug-97 | Image Processing Method and Apparatus (ART47) |
| PO8502 | 11-Aug-97 | Image Processing Method and Apparatus (ART48) |
| PO7981 | 15-Jul-97 | Data Processing Method and Apparatus (ART50) |
| PO7986 | 15-Jul-97 | Data Processing Method and Apparatus (ART51) |
| PO7983 | 15-Jul-97 | Data Processing Method and Apparatus (ART52) |
| PO8026 | 15-Jul-97 | Image Processing Method and Apparatus (ART53) |
| PO8027 | 15-Jul-97 | Image Processing Method and Apparatus (ART54) |
| PO8028 | 15-Jul-97- | Image Processing Method and Apparatus (ART56) |
| PO9394 | 23-Sep-97 | Image Processing Method and Apparatus (ART57) |
| PO9396 | 23-Sep-97 | Data Processing Method and Apparatus (ART58) |
| PO9397 | 23-Sep-97 | Data Processing Method and Apparatus (ART59) |
| PO9398 | 23-Sep-97 | Pata Processing Method and Apparatus (ART60) |
| PO9399 | 23-Sep-97 | Data Processing Method and Apparatus (ART61) |
| PO9400 | 23-Sep-97 | Data Processing Method and Apparatus (ART62) |
| PO9401 | 23-Sep-97 | Data Processing Method and Apparatus (ART63) |
| PO9402 | 23-Sep-97 | Data Processing Method and Apparatus (ART64) |
| PO9403 | 23-Sep-97 | Data Processing Method and Apparatus (ART65) |
| PO9405 | 23-Sep-97 | Data Processing Method and Apparatus (ART66) |
| PPO959 | 16-Dec-97 | A Data Processing Method and Apparatus (ART68) |
| PP1397 | 19-Jan-98 | A Media Device (ART69) |

We claim:

1. A method of manufacturing an ink jet printhead which includes:

providing a substrate;

depositing a doped layer on the substrate and etching said layer to create an array of nozzles on the substrate with a nozzle chamber in communication with each nozzle; and utilizing planar monolithic deposition, lithographic and etching processes to create a paddle arranged in each nozzle chamber each paddle being pivotally arranged relative to the nozzle and having a current-carrying device therein so that when a magnetic field is applied to the paddle, a lorenz force is exerted on the paddle to cause pivoting of the paddle and ejection of ink from the nozzle.

2. A method of manufacturing an ink jet printhead as claimed in claim 1 wherein multiple ink jet printheads are formed simultaneously on the substrate.

3. A method of manufacturing an ink jet printhead as claimed in claim 1 wherein said substrate is a silicon wafer.

4. A method of manufacturing an ink jet printhead as claimed in claim 1 wherein integrated drive electronics are formed on the same substrate.

5. A method of manufacturing an ink jet printhead as claimed in claim 4 wherein said integrated drive electronics are formed using a CMOS fabrication process.

6. A method of manufacturing an ink jet printhead as claimed in claim 1 wherein ink is ejected from said substrate normal to said substrate.

7. A method of manufacture of an ink jet printhead arrangement including a series of nozzle chambers, said method comprising the steps of:

(a) utilising an initial semiconductor wafer having an electrical circuitry layer and a buried epitaxial layer formed thereon, in addition to a top protecting layer having a series of vias interconnected to predetermined portions of said circuitry layer;

(b) forming on said semiconductor wafer layer a first conductive layer including a first conductive coil interconnected to predetermined portions of said circuitry layer;

(c) depositing and etching, on said first conductive layer, a non-conductive layer including predetermined vias for the interconnection of subsequent layers with lower layers;

(d) forming a second conductive layer on said non-conductive layer, including a second conductive coil and the interconnection of predetermined portions of said coil with said first conductive coil and said circuitry layer;

(e) depositing and etching a second non-conductive layer over said second conductive layer said etching including etching a series of slots in said second non-conductive layer;

(f) etching a series of slots through said first and second non-conductive layer and said first and second conductive layers so as to define a nozzle paddle;

(g) etching said semiconductor wafer under said nozzle paddle so as to define a nozzle chamber;

(h) back etching said semiconductor wafer to said epitaxial layer; and (i) etching said epitaxial layer to define a nozzle ejection hole therein interconnecting with said nozzle chamber.

8. A method as claimed in claim 7 wherein said step (g) utilizes said epitaxial layer as an etch stop.

9. A method as claimed in claim 7 wherein said step (g) comprises a crystallographic etch.

10. A method as claimed in claim 7 wherein said step (i) includes etching a series of small holes in a wall of said nozzle chamber interconnecting said chamber with the ambient atmosphere.

11. A method as claimed in claim 7 wherein said first conductive layer and said second conductive layer are formed from substantially copper.

12. A method as claimed in claim 7 further including the step of depositing corrosion barriers over portions of said arrangement so as to reduce corrosion effects.

13. A method as claimed in claim 7 wherein said wafer comprises a double side polished CMOS wafer.

14. A method as claimed in claim 7 wherein step (i) is also utilized to simultaneously separate said wafer into separate printheads.

* * * * *